United States Patent
Kim

(10) Patent No.: US 8,564,234 B2
(45) Date of Patent: Oct. 22, 2013

(54) DRIVING CIRCUITS, POWER DEVICES AND ELECTRIC DEVICES INCLUDING THE SAME

(75) Inventor: Ho-jung Kim, Suwon-si (KR)

(73) Assignee: Samsung Electronics, Co., Ltd., Gyeonggi-Do (KR)

( * ) Notice: Subject to any disclaimer, the term of this patent is extended or adjusted under 35 U.S.C. 154(b) by 301 days.

(21) Appl. No.: 12/929,779

(22) Filed: Feb. 15, 2011

(65) Prior Publication Data

US 2011/0273116 A1    Nov. 10, 2011

(30) Foreign Application Priority Data

May 4, 2010   (KR) ........................ 10-2010-0042084

(51) Int. Cl.
 *H02P 7/00*    (2006.01)

(52) U.S. Cl.
 USPC ........................... 318/432; 318/433; 318/434

(58) Field of Classification Search
 USPC ............... 318/432, 433, 434, 3; 327/108, 112
 See application file for complete search history.

(56) References Cited

U.S. PATENT DOCUMENTS

| | | | |
|---|---|---|---|
| 5,872,477 A | 2/1999 | Price, Jr. | |
| 6,114,895 A | 9/2000 | Stephens | |
| 6,307,409 B1 | 10/2001 | Wrathall | |
| 6,400,177 B1 | 6/2002 | Yoshizaki | |
| 6,538,479 B2 | 3/2003 | Bellomo et al. | |
| 6,545,513 B2 | 4/2003 | Tsuchida et al. | |
| 6,917,227 B1 | 7/2005 | Ochi | |
| 6,943,611 B2 | 9/2005 | Braun et al. | |
| 7,123,060 B1 | 10/2006 | Chen et al. | |
| 7,196,890 B2 * | 3/2007 | Smith | 361/91.1 |
| 7,786,759 B2 | 8/2010 | Huang et al. | |
| 2002/0171455 A1 | 11/2002 | Tsuchida et al. | |
| 2003/0179035 A1 | 9/2003 | Braun et al. | |
| 2008/0150581 A1 * | 6/2008 | Huang et al. | 326/80 |
| 2008/0153215 A1 | 6/2008 | Sandhu et al. | |
| 2008/0265980 A1 | 10/2008 | Reichl et al. | |
| 2011/0273116 A1 | 11/2011 | Kim | |

FOREIGN PATENT DOCUMENTS

JP    2003078401 A    3/2003

OTHER PUBLICATIONS

U.S. Office Action issued in U.S. Appl. No. 13/064,264, mailed Jan. 2, 2013.
U.S. Office Action issued in U.S. Appl. No. 13/064,264, mailed Aug. 22, 2013.

* cited by examiner

*Primary Examiner* — Karen Masih
(74) *Attorney, Agent, or Firm* — Harness, Dickey & Pierce, P.L.C.

(57) ABSTRACT

A power device includes a switching device and a control unit. The switching device has a control terminal and an output terminal. The control unit is configured to control a rising time required for a driving voltage for controlling the switching device to reach a target level such that a voltage between the control terminal and the output terminal is maintained less than or equal to a critical voltage. When the voltage between the control terminal and the output terminal is greater than the critical voltage, leakage current is generated between the control terminal and the output terminal.

26 Claims, 13 Drawing Sheets

DRIVING CIRCUITS, POWER DEVICES AND ELECTRIC DEVICES INCLUDING THE SAME

CROSS-REFERENCE TO RELATED APPLICATION(S)

This application claims priority under 35 U.S.C. §119 to Korean Patent Application No. 10-2010-0042084, filed on May 4, 2010, in the Korean Intellectual Property Office, the entire contents of which are incorporated herein by reference.

BACKGROUND

1. Field

Example embodiments relate to driving circuits, power devices and electric devices including the same.

2. Description of the Related Art

Power devices transform input power from an external source into output power having a voltage or current level desired by a user. Power devices then supply the output power to devices requiring power. Power devices are used in home appliances such as portable terminals, laptop computers, and the like. Power devices for driving electric motors are also used in recently-developed and environmentally friendly ("green") vehicles such as electric vehicles, hybrid vehicles, fuel-cell vehicles, and the like.

SUMMARY

At least some example embodiments provide power devices using relatively high voltages.

At least some example embodiments may suppress and/or prevent a leakage current from being generated in a switching device of a power device.

At least some example embodiments also provide gate driving circuits capable of suppressing and/or preventing leakage current from being generated between a gate and a source of a switching device such as a transistor.

At least some example embodiments provide electric devices and systems including power devices.

Additional aspects will be set forth in part in the description which follows and, in part, will be apparent from the description, or may be learned by practice of example embodiments.

According to at least one example embodiment, a power device includes a switching device and a control unit. The switching device has a control terminal and an output terminal. The control unit is configured to control a rising time of a driving voltage for controlling the switching device such that a voltage between the control terminal and the output terminal is maintained less than or equal to a critical voltage. The rising time refers to a period of time required for the driving voltage to reach a target level. When the voltage between the control terminal and the output terminal is greater than the critical voltage, leakage current is generated between the control terminal and the output terminal.

At least one other example embodiment provides a vehicle having an electrical component. The vehicle includes a power device configured to generate a power supply voltage by at least one of up-converting, down-converting and inverting a supply voltage from a battery, and an electric motor configured to drive the at least partially electric vehicle according to the power supply voltage. The power device includes a switching device and a control unit. The switching device has a control terminal and an output terminal. The control unit is configured to control a rising time of a driving voltage for controlling the switching device such that a voltage between the control terminal and the output terminal is maintained less than or equal to a critical voltage. The rising time refers to a period of time required for the driving voltage to reach a target level. When the voltage between the control terminal and the output terminal is greater than the critical voltage, leakage current is generated between the control terminal and the output terminal.

According to at least some example embodiments, the control unit may control the rising time of the driving voltage based on a voltage at the output terminal. The control unit may increase the rising time of the driving voltage based on the voltage at the output terminal.

The control unit may include a feedback unit and a driving unit. The feedback unit may be configured to provide a feedback signal based on a difference between the voltage at the output terminal and the driving voltage. The driving unit may be configured to selectively provide the driving voltage to the control terminal based on the feedback signal.

The driving unit may include a power supply voltage providing unit and a driving voltage providing unit. The power supply voltage providing unit may be configured to provide a power supply voltage to a first node based on the feedback signal. The driving voltage providing unit may be configured to provide the control terminal with one of a voltage at the first node and a ground voltage based on a control signal received from an external source.

According to at least some example embodiments, the feedback unit may be configured to provide a positive feedback signal to decrease the rising time of the driving voltage, but provide a negative feedback signal to increase the rising time of the driving voltage. The power supply voltage providing unit may be configured to provide the power supply voltage to the first node in response to the positive feedback signal, but not in response to the negative feedback signal.

According to at least some example embodiments, the feedback unit may include a voltage addition unit and a comparator. The voltage addition unit may be configured to add the voltage at the output terminal to the critical voltage to generate a sum voltage. The comparator may be configured to generate the feedback signal based on a comparison between the sum voltage and the driving voltage. According to at least this example embodiment, the comparator may generate a positive feedback signal when the sum voltage is greater than the driving voltage, but generate a negative feedback signal when the sum voltage is less than or equal to the driving voltage.

According to at least some other example embodiments, the feedback unit may include a voltage distribution unit; a voltage addition unit; and a comparator. The voltage distribution unit may be configured to generate a distribution voltage by distributing the critical voltage. The distribution voltage may have a voltage level less than the critical voltage. The voltage addition unit may be configured to add the voltage at the output terminal to the distribution voltage to generate a sum voltage. The comparator may be configured to generate the feedback signal based on a comparison between the sum voltage and the driving voltage. The comparator may generate a positive feedback signal when the sum voltage is greater than the driving voltage, but generate a negative feedback signal when the sum voltage is less than or equal to the driving voltage.

According to at least some other example embodiments, the feedback unit may include first through third voltage distribution units; a voltage addition unit; and a comparator. The first voltage distribution unit may be configured to generate a first distribution voltage by distributing the critical voltage. The first distribution voltage may have a voltage level less than the critical voltage. The voltage addition unit may be configured to add the voltage at the output terminal to the first distribution voltage to generate a sum voltage. The second voltage distribution unit may be configured to generate a second distribution voltage by distributing the sum voltage. The second distribution voltage may have a voltage level less than the sum voltage. The third voltage distribution unit may be configured to generate a third distribution voltage by distributing the driving voltage. The third distribution voltage may have a voltage level less than the driving voltage. The comparator may be configured to generate the feedback signal based on a comparison between the second distribution voltage and the third distribution voltage. The comparator may generate a positive feedback signal when the second distribution voltage is greater than the third distribution voltage, but generate a negative feedback signal when the second distribution voltage is less than or equal to the third distribution voltage.

According to yet at least some other example embodiments, the feedback unit may include a voltage subtraction unit and a comparator. The voltage subtraction unit may be configured to subtract the critical voltage from the driving voltage to generate a subtraction voltage. The comparator may be configured to generate the feedback signal based on a comparison between the subtraction voltage and the voltage at the output terminal. The comparator may generate a positive feedback signal when the voltage at the output terminal is greater than the subtraction voltage, but generate a negative feedback signal when the voltage at the output terminal is less than or equal to the subtraction voltage.

According to at least some example embodiments, the feedback unit may include a voltage distribution unit; a voltage subtraction unit; and a comparator. The voltage distribution unit may be configured to generate a distribution voltage by distributing the critical voltage. The distribution voltage may have a voltage level less than the critical voltage. The voltage subtraction unit may be configured to subtract the distribution voltage from the driving voltage to generate a subtraction voltage. The comparator may be configured to generate the feedback signal based on a comparison between the subtraction voltage and the voltage at the output terminal. The comparator may generate a positive feedback signal when the voltage at the output terminal is greater than the subtraction voltage, but generate a negative feedback signal when the voltage at the output terminal is less than or equal to the subtraction voltage.

According to at least some other example embodiments, the feedback unit may include first through third voltage distribution units; a voltage subtraction unit; and a comparator. The first voltage distribution unit may be configured to generate a first distribution voltage by distributing the critical voltage. The first distribution voltage may have a voltage level less than the critical voltage. The voltage subtraction unit may be configured to subtract the first distribution voltage from the driving voltage to generate a subtraction voltage. The second voltage distribution unit may be configured to generate a second distribution voltage by distributing the subtraction voltage. The second distribution voltage may have a voltage level less than the subtraction voltage. The third voltage distribution unit may be configured to generate a third distribution voltage by distributing the voltage at the output terminal. The third distribution voltage may have a voltage level less than the voltage at the output terminal. The comparator may be configured to generate the feedback signal based on a comparison between the second distribution voltage and the third distribution voltage. The comparator may generate a positive feedback signal when the third distribution voltage is greater than the second distribution voltage, but generate a negative feedback signal when the third distribution voltage is less than or equal to the second distribution voltage.

According to at least some other example embodiments, the control unit may include a feedback unit and a driving unit. The feedback unit may be configured to generate a feedback signal based on the voltage at the output terminal. The driving unit may be configured to provide the control terminal with the driving voltage based on the feedback signal. In at least this example embodiment, the driving voltage may have a multi-step waveform in which at least one of a width and a height of each step varies. The feedback signal may be a pulse signal having a plurality of pulses, which are sequentially turned on/off as the voltage of the output terminal increases. The plurality of pulses may determine a time at which a voltage corresponding to a next step of the multi-step waveform is applied.

According to at least some example embodiments, the feedback unit may include an analog-to-digital converter and a pulse generation unit. The analog-to-digital converter may be configured to convert the voltage at the output terminal from an analog value to a digital value. The pulse generation unit may be configured to generate a pulse signal including a plurality of pulses, which are each turned on/off according to the digital value. The pulse generation unit may control the pulse width of each of the plurality of pulses in inverse proportion to the inclination of the voltage of the output terminal.

According to at least some example embodiments, the driving unit may include a plurality of voltage generation units and a driving voltage providing unit. The plurality of voltage generation units may be configured to generate different levels of voltages. The driving voltage providing unit may be configured to, based on the feedback signal, provide a voltage generated by one of the plurality of voltage generation units to the control terminal as the driving voltage.

The driving voltage providing unit may include a plurality of switches connected to the plurality of voltage generation units, respectively. Each of the plurality of switches may be turned on/off according to a logic level of the feedback signal.

The switching device may include a transistor having a gate, a source, and a drain. The control terminal may correspond to the gate and the output terminal may correspond to the source.

At least one other example embodiment provides a gate driving circuit configured to provide a driving voltage to a gate of a transistor. The gate driving circuit includes a feedback unit and a driving unit. The feedback unit is configured to provide a feedback signal for controlling the driving voltage based on a source voltage of the transistor. The driving unit is configured to control, based on the feedback signal, a rising time of the driving voltage so that a voltage between the gate and a source of the transistor is maintained less than or equal to a critical voltage. The rising time refers to a period of time required for the driving voltage to reach a target level. When the voltage between the gate and the source is greater than the critical voltage, leakage current is generated between the gate and the source.

According to at least some example embodiments, the driving unit may selectively provide the driving voltage to the gate based on the feedback signal. The driving unit may be configured to provide the gate with the driving voltage having a multi-step waveform in which at least one of a width and a height of each step varies, based on the feedback signal.

According to one or more example embodiments, a rising time of the driving voltage is controlled so that a voltage between a control terminal and an output terminal of a switching device is maintained less than or equal to a critical voltage thereby suppressing and/or preventing generation of leakage current between the control terminal and the output terminal. Thus, noise that may be generated due to the leakage current in a power device may be suppressed and/or prevented, malfunction due to the leakage current may be suppressed and/or prevented, and power consumption may be reduced. Rising time refers to a period of time required for a driving voltage to reach a target level.

According to at least some example embodiments, a feedback signal may be generated based on a difference between a voltage at the output terminal of the switching device and a voltage at the control terminal of the switching device. A driving voltage may be selectively provided to the control terminal by controlling the turning on/off of the driving unit according to the feedback signal. Thus, a rising time of the voltage of the control terminal may be adaptively controlled according to the voltage of the output terminal and generation of leakage current in the switching device may be suppressed and/or prevented.

A plurality of pulses, which are sequentially turned on/off as the voltage at the output terminal of the switching device increases, and a driving voltage having a multi-step waveform, in which at least one of a width and a height of each step varies, may be provided based on the plurality of pulses. Thus, the rising time of the voltage at the control terminal may be adaptively controlled according to the voltage at the output terminal. Accordingly, generation of leakage current in the switching device may be suppressed and/or prevented.

According to at least some example embodiments, an electric device includes the power device as described above and an electric circuit. The power device generates a power supply voltage by at least one of up-converting, down-converting and inverting a supply voltage. The electric circuit receives the power supply voltage and operates according to the power supply voltage.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
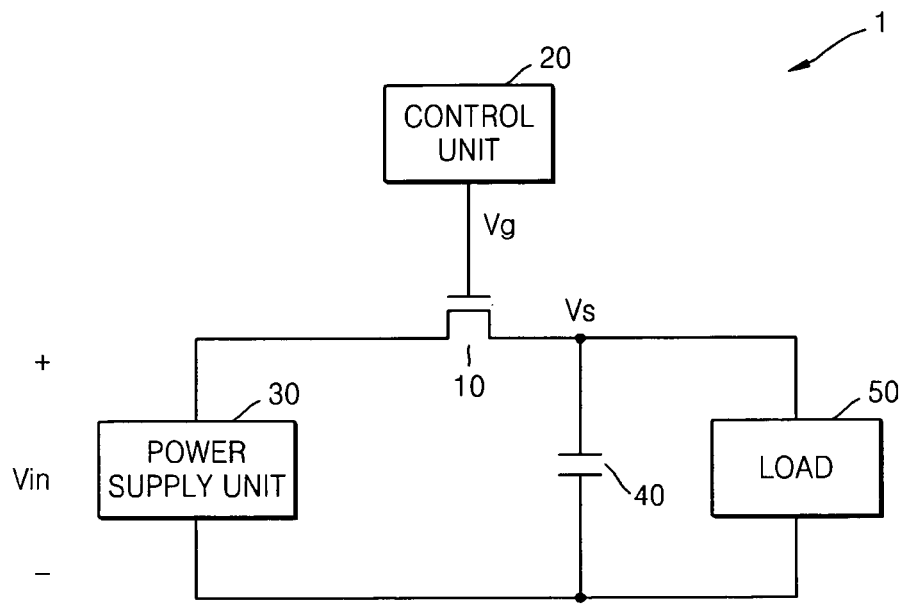
FIG. 1 is a schematic block diagram of a power device according to an example embodiment.

Example embodiments will now be described more fully with reference to the accompanying drawings. Like reference numerals in the drawings denote like elements.

Detailed example embodiments are disclosed herein. However, specific structural and functional details disclosed herein are merely representative for purposes of describing example embodiments. Example embodiments may, however, may be embodied in many alternate forms and should not be construed as limited to only the example embodiments set forth herein.

It should be understood, however, that there is no intent to be limited to the particular example embodiments disclosed, but on the contrary example embodiments are to cover all modifications, equivalents, and alternatives falling within the scope of this disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments are discussed herein as "units." However, example embodiments may also be characterized as "circuits." For example, the control unit 20 shown in FIG. 1 may be referred to as a "control circuit 20," the power supply unit 30 may be referred to as the "power supply circuit 30," etc.

FIG. 1 is a schematic block diagram of a power device 1 according to an example embodiment.

Referring to FIG. 1, the power device 1 includes a switching device 10, a control unit 20, a power supply unit 30, a charge storage device (e.g., capacitor) 40 and a load 50. According to this example embodiment, the power device 1 may be a power circuit in which the load 50 is selectively provided with a power supply voltage Vin from the power supply unit 30 according to an on/off operation of the switching device 10. This type of power device 1 may be used, for example, in electric vehicles/automobiles (e.g., hybrid electric vehicles (HEV), fuel cell (FC) vehicles, etc.) and/or general electronic apparatuses (e.g., switching mode power supplies (SMPS), photovoltaic power supplies, etc.)

Although not shown in FIG. 1, the power device 1 may further include at least one diode, at least one resistor, at least one inductor and/or at least one capacitor. Thus, a boosted voltage, a reduced voltage and/or an inverted voltage may be provided to the load 50.

The power supply voltage Vin may have a relatively high voltage level, for example, between about 10 V and about 1000 V. Although not shown in FIG. 1, the power supply unit 30 may include a plurality of power supplies serially connected to each other, for example, a plurality of solar cells, photovoltaic cells and/or a secondary battery.

Still referring to FIG. 1, the switching device 10 is configured to be turned on/off by the control unit 20 to selectively transmit the power supply voltage Vin from the power supply unit 30 to the load 50. In this example, the switching device 10 transmits a smoothened voltage to the load 50 using the capacitor 40.

In more detail, the switching device 10 has a control terminal, an input terminal, and an output terminal. The control terminal is connected to the control unit 20, the input terminal is connected to the power supply unit 30, and the output terminal is connected to the load 50.

According to at least this example embodiment, the switching device 10 may be a high-voltage transistor having a gate, a drain, and a source and being capable of enduring a relatively high voltage. In this example, the gate corresponds to the control terminal, the drain corresponds to the input terminal, and the source corresponds to the output terminal. According to at least some example embodiments, the switching device 10 may be a high electron mobility transistor (HEMT) or heterojunction field effect transistor (HFET) formed of gallium nitride (GaN), silicon carbide (SiC), or the like. An example embodiment in which the switching device 10 is a high-voltage transistor will now be described.

Figure 2:
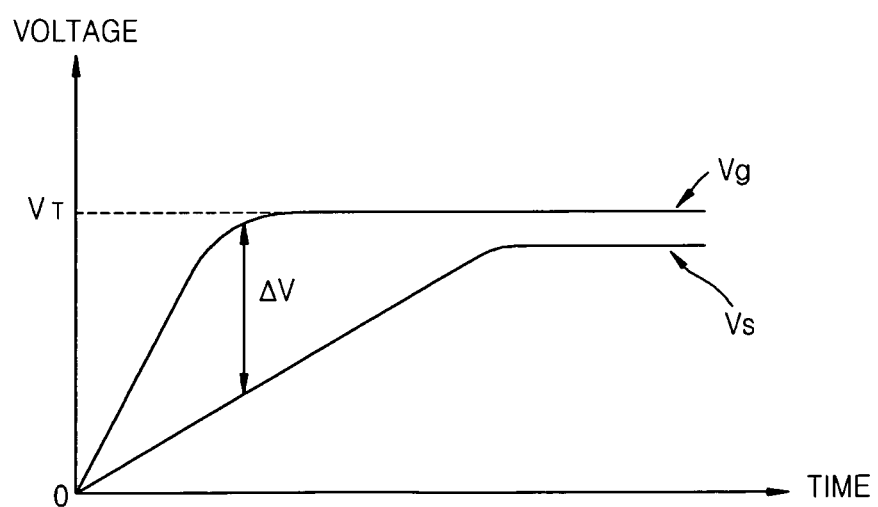
FIG. 2 is a graph of voltage versus time showing a gate voltage and a source voltage of a switching device included in the power device illustrated in FIG. 1 when a control unit included in the power device illustrated in FIG. 1 does not operate properly.

FIG. 2 is a graph of voltage versus time showing a gate voltage Vg and a source voltage Vs of the switching device 10 of FIG. 1 when the control unit 20 of the power device 1 of FIG. 1 does not operate properly.

Referring to FIG. 2, in the switching device 10, the source voltage Vs increases as the gate voltage Vg increases. A rate of increase (or slope) of the gate voltage Vg is greater than that of the source voltage Vs, and thus, the inclination of the gate voltage Vg is greater than that of the source voltage Vs.

In FIG. 2, the gate voltage Vg eventually reaches a target level $V_T$, whereas the source voltage Vs only reaches a voltage level that is less than the gate voltage Vg by a threshold voltage of the switching device 10. However, the source voltage Vs and the gate voltage Vg of the switching device 10 may reach the same or substantially the same level.

When a difference ΔV between the gate voltage Vg and the source voltage Vs (also referred to as voltage Vgs between the gate and the source of the switching device 10) is greater than a critical voltage $V_{GL}$, leakage current flows between the gate and the source of the switching device 10. The critical voltage $V_{GL}$ is a minimum voltage level at which leakage current is generated between the gate and the source of the switching device 10. The generation of leakage current in the switching device 10 may result in, for example, increased noise in the power device 1, increased possibility that the power device 1 malfunctions and/or increased overall power consumption. In one example, when a voltage applied to the switching device 10 is a relatively high voltage, the leakage current flowing between the gate and the source is relatively large, which may be problematic.

Figure 3:
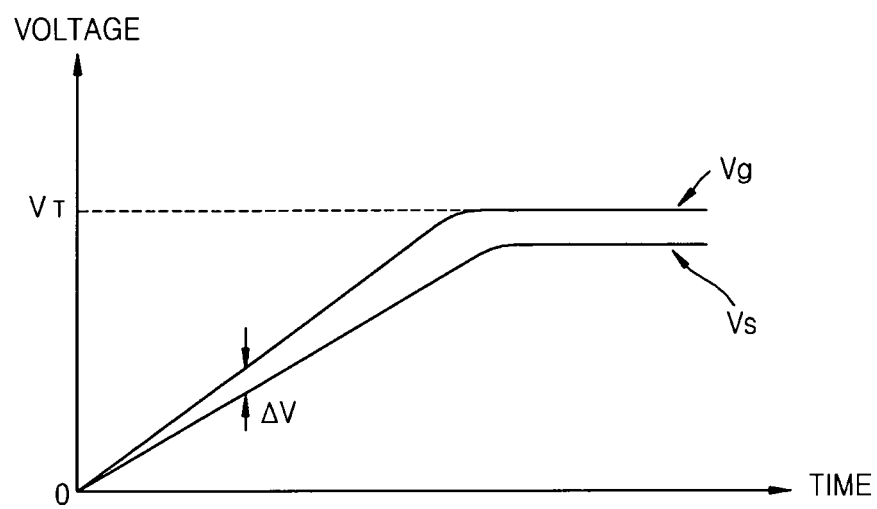
FIG. 3 is a graph of voltage versus time showing a gate voltage and a source voltage of the switching device included in the power device illustrated in FIG. 1 when the control unit in the power device illustrated in FIG. 1 operates properly.

FIG. 3 is a graph of voltage versus time showing the gate voltage Vg and the source voltage Vs of the switching device 10 of FIG. 1 when the control unit 20 of the power device 1 of FIG. 1 operates properly.

Referring to FIGS. 1 and 3, the control unit 20 provides a driving voltage to the gate of the switching device 10 so as to control the on/off operation of the switching device 10. In more detail, the control unit 20 controls a period of time required for the driving voltage to reach the target level $V_T$ (referred to herein as a rising time of the driving voltage), so that the voltage Vgs between the gate and the source of the switching device 10 is maintained less than or equal to the critical voltage $V_{GL}$. To do so, the control unit 20 increases the rising time of the driving voltage.

As the rising time of the gate voltage Vg increases, the inclination of the gate voltage Vg decreases. Thus, a difference between the inclination of the gate voltage Vg and the inclination of the source voltage Vs curve also decreases. And, the difference ΔV between the gate voltage Vg and the source voltage Vs is less than or equal to the critical voltage $V_{GL}$. Consequently, generation of leakage current between the gate and the source of the switching device 10 may be suppressed.

Figure 4:
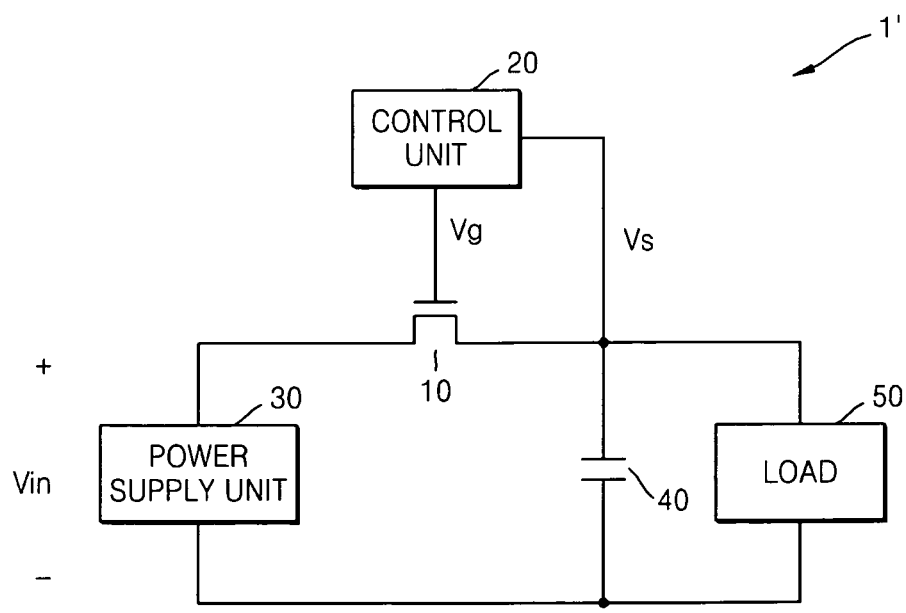
FIG. 4 is a schematic block diagram of a power device according to another example embodiment.

FIG. 4 is a schematic block diagram of a power device 1' according to an example embodiment.

Referring to FIG. 4, the power device 1' includes a switching device 10, a control unit 20, a power supply unit 30, a charge storage device (e.g., capacitor) 40, and a load 50. The power device 1' according to at least this example embodiment is similar to the power device 1 shown in FIG. 1. Thus, a description of duplicate portions will be omitted. The power device 1' will be described by focusing on differences between the power devices 1 and 1'.

In FIG. 4, the control unit 20 is connected to the source of the switching device 10 to detect the source voltage Vs. The control unit 20 is configured to control the driving voltage Vg supplied to the gate of the switching device 10 based on the detected source voltage Vs.

The control unit 20 controls the driving voltage Vg based on the source voltage Vs such that the rising time of the driving voltage Vg increases. To do so, the control unit 20 is connected to the source, which corresponds to the output terminal, of the switching device 10 to adaptively control the driving voltage Vg supplied to the gate of the switching device 10 based on the source voltage Vs.

Figure 5:
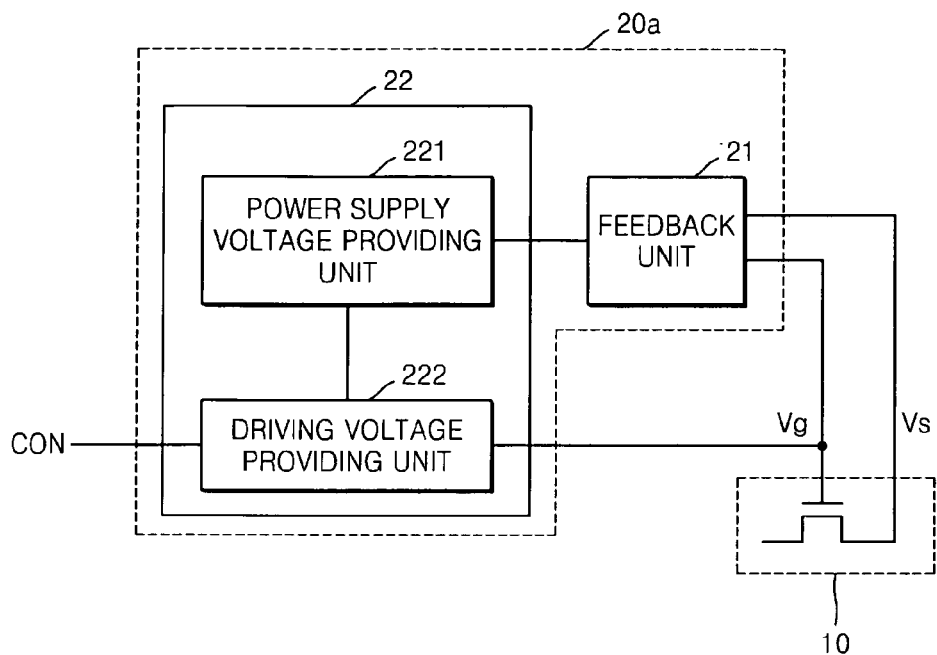
FIG. 5 is a schematic block diagram of an example embodiment of the control unit of the power device illustrated in FIG. 4.

FIG. 5 is a schematic block diagram of an example embodiment of the control unit 20 shown in FIG. 4.

Referring to FIG. 5, the control unit 20a includes a feedback unit 21 and a driving unit 22. The driving unit 22 includes a power supply voltage providing unit 221 and a driving voltage providing unit 222. Example operation of the control unit 20a will now be described in more detail.

The feedback unit 21 receives the source voltage Vs and the gate voltage Vg of the switching device 10 and generates a feedback signal based on the source voltage Vs and the gate voltage Vg. The feedback unit 21 provides the feedback signal to the driving unit 22. When a difference between the gate voltage Vg and the source voltage Vs is less than or equal to the critical voltage $V_{GL}$, the feedback unit 21 provides a positive feedback signal such that the rising time of the gate voltage Vg decreases. But, when the difference between the gate voltage Vg and the source voltage Vs is greater than the critical voltage $V_{GL}$, the feedback unit 21 provides a negative feedback signal such that the rising time of the gate voltage Vg increases.

The power supply voltage providing unit 221 provides a power supply voltage in response to the positive feedback signal from the feedback unit 21, but does not provide the power supply voltage in response to the negative feedback signal from the feedback unit 21.

Based on a control signal CON received from an external source, the driving voltage providing unit 222 provides either a ground voltage or the power supply voltage from the power supply voltage providing unit 221 to the gate of the switching device 10 as the driving voltage.

According to at least one example embodiment, the feedback unit 21 generates the feedback signal based on the difference ΔV between the gate voltage Vg and the source voltage Vs. The power supply voltage is selectively provided to the gate of the switching device 10 by turning the driving unit 22 on/off. Thus, even without change in the control signal CON, the rising time of the gate voltage Vg may adaptively increase according to the source voltage Vs.

Figure 6:
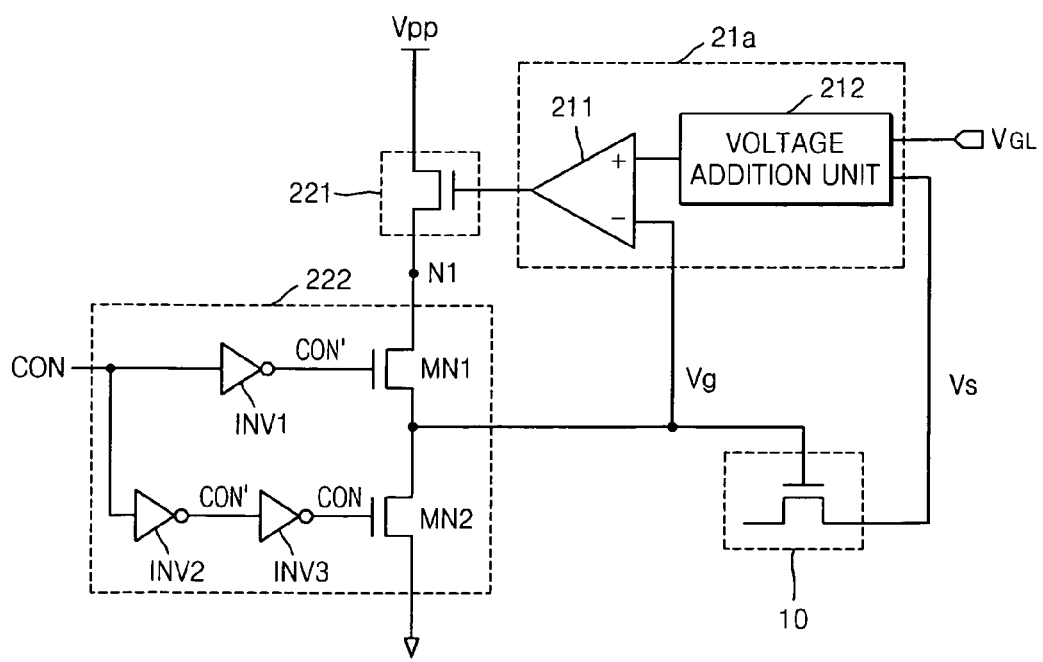
FIG. 6 is a schematic circuit diagram of an example embodiment of the control unit illustrated in FIG. 5.

FIG. 6 is a schematic circuit diagram of an example embodiment of the control unit 20a of FIG. 5.

Referring to FIG. 6, the feedback unit 21a includes a comparator 211 and a voltage addition unit 212. Example operation of the feedback unit 21a will now be described in more detail.

The voltage addition unit 212 receives the source voltage Vs and the critical voltage $V_{GL}$ and adds the source voltage Vs to the critical voltage $V_{GL}$ to generate a sum voltage. The critical voltage $V_{GL}$ may be preset based on the current-voltage characteristics of the switching device 10. In one example, the current-voltage characteristics of the switching device 10 may include a variation in the gate voltage Vg with respect to time, a variation in the source voltage Vs with respect to time, a variation in a leakage current flowing between the gate and the source with respect to the voltage Vgs between the gate and the source, a variation in a current between the drain and the source with respect to a voltage between the drain and the source, a resistance when the switching device 10 is turned on, and the like.

The comparator 211 receives the sum voltage via its positive input terminal and receives the gate voltage Vg via its negative input terminal. The comparator 211 generates a feedback signal based on a comparison between the sum voltage and the gate voltage Vg. In one example, the comparator 211 outputs a positive feedback signal when the sum voltage is greater than the gate voltage Vg, but outputs a negative feedback signal when the sum voltage is less than or equal to the gate voltage Vg.

The power supply voltage providing unit 221 provides a power supply voltage $V_{pp}$ to a first node N1 in response to the positive feedback signal, but does not provide the power supply voltage $V_{pp}$ to the first node N1 in response to the negative feedback signal.

According to least this example embodiment, the power supply voltage providing unit 221 is an n-type metal oxide semiconductor (NMOS) transistor having a drain connected to the power supply voltage $V_{pp}$, a gate configured to receive the feedback signal from the feedback unit 21a, and a source connected to the first node N1. In this example, the NMOS transistor is turned on in response to the positive feedback signal from the feedback unit 21a, but turned off in response to the negative feedback signal from the feedback unit 21a.

Still referring to FIG. 6, the driving voltage providing unit 222 provides either the voltage at the first node N1 or a ground voltage to the gate of the switching device 10 based on the control signal CON received from the external source. In at least one example embodiment, the control signal CON may be a clock signal having a given, desired or predetermined cycle. In at least one other example embodiment, the control signal CON may be a pulse signal that is activated in a section where the switching device 10 is intended to be turned on.

As shown in FIG. 6, the driving voltage providing unit 222 includes first through third inverters INV1, INV2 and INV3, and first and second NMOS transistors MN1 and MN2.

The first NMOS transistor MN1 has a drain connected to the first node N1 and a gate connected to an output terminal of the first inverter INV1. In this example, the first NMOS transistor MN1 functions as a pull-up device.

The second NMOS transistor MN2 has a drain connected to a source of the first NMOS transistor MN1, a gate connected to an output terminal of the third inverter INV3, and a source connected to a ground terminal. In this example, the second NMOS transistor MN2 functions as a pull down device.

The first inverter INV1 inverts the control signal CON to output an inverted control signal CON' to the first NMOS transistor MN1. The second inverter INV2 inverts the control signal CON to output the inverted control signal CON' to the third inverter INV3. The third inverter INV3 inverts the inverted control signal CON' to output the control signal CON to the second NMOS transistor MN2. The first through third inverters INV1 through INV3 included in the driving voltage providing unit 222 are examples, and the number of inverters included in the driving voltage providing unit 222 may be changed.

In one example operation, when the control signal CON is logic '1', the first inverter INV1 inverts the control signal CON to output logic '0'. The first NMOS transistor MN1 is turned off in response to the logic '0'.

In this example, the second inverter INV2 inverts the control signal CON to output the inverted control signal CON' (logic '0'), and the third inverter INV3 inverts the inverted control signal CON' to output logic '1'. The second NMOS transistor MN2 is turned on in response to the logic '1'.

Accordingly, the driving voltage providing unit 222 applies the ground voltage to the gate of the switching device 10.

In another example, when the control signal CON is logic '0', the first inverter INV1 inverts the control signal CON to output logic '1'. The first NMOS transistor MN1 is turned on in response to the logic '1'.

In this example, the second inverter INV2 inverts the control signal CON (logic '0') to output the inverted control signal CON' (logic '1') and the third inverter INV3 inverts the inverted control signal CON' to output logic '0'. The second NMOS transistor MN2 is turned off in response to the logic, '0'.

Accordingly, the driving voltage providing unit 222 applies the voltage at the first node N1 to the gate of the switching device 10.

When the power supply voltage providing unit 221 is turned on and applies the power supply voltage $V_{pp}$ to the first node N1, the driving voltage providing unit 222 applies the power supply voltage $V_{pp}$ to the gate of the switching device 10. On the other hand, when the power supply voltage providing unit 221 is turned off and does not apply the power supply voltage $V_{pp}$ to the first node N1, the driving voltage providing unit 222 does not apply the power supply voltage $V_{pp}$ to the gate of the switching device 10.

According to at least this example embodiment, the control unit 20a controls the driving voltage applied to the gate of the switching device 10 by adaptively adjusting the feedback signal output by the feedback unit 21a based on the source voltage Vs without separately correcting the control signal CON. The control unit 20a intermittently or selectively applies the driving voltage to the gate of the switching device 10 so that the difference $\Delta V$ between the gate voltage Vg and the source voltage Vs of the switching device 10 is maintained less than or equal to the critical voltage $V_{GL}$. Accordingly, generation of leakage current between the gate and the source of the switching device 10 may be suppressed and/or prevented.

Figure 7:
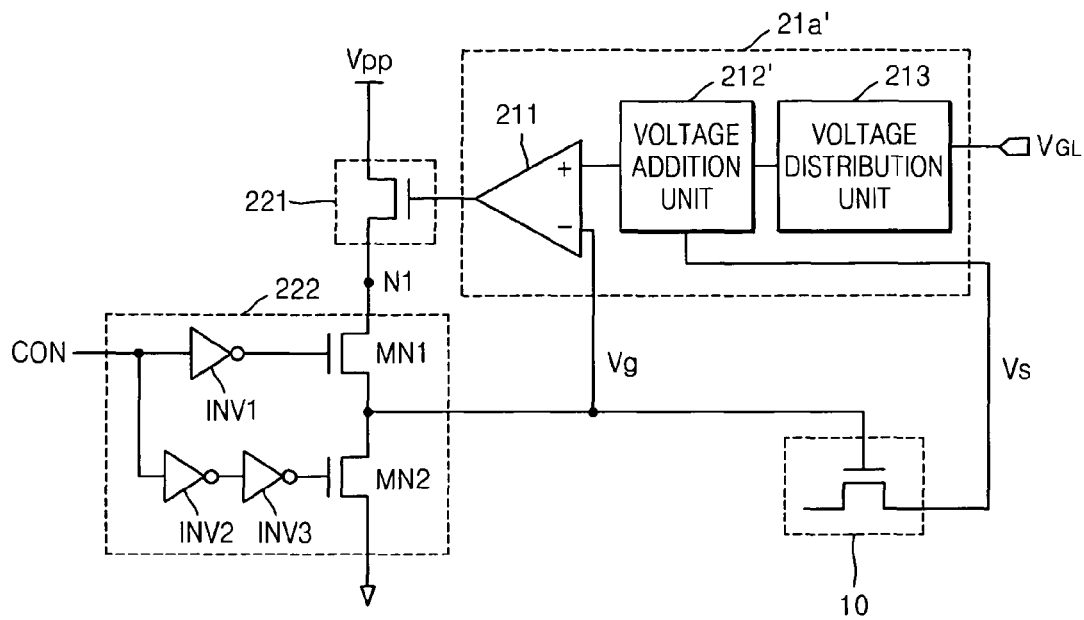
FIG. 7 is a schematic circuit diagram of another example embodiment of the control unit illustrated in FIG. 5.

FIG. 7 is a schematic circuit diagram of another example embodiment of the control unit 20a shown in FIG. 5.

Referring to FIG. 7, a feedback unit 21a' includes a comparator 211, a voltage addition unit 212', and a voltage distribution unit 213. The feedback unit 21a' is similar to the feedback unit 21a of FIG. 6, but further includes a voltage distribution unit 213. A description of duplicate portions of the feedback unit 21a and the feed back unit 21a' is omitted for the sake of brevity.

In the example embodiment shown in FIG. 7, the voltage distribution unit 213 distributes the critical voltage $V_{GL}$ to generate a distribution voltage that is lower than the critical voltage $V_{GL}$. The critical voltage $V_{GL}$ may be given, desired and/or predetermined based on the current-voltage characteristics of the switching device 10. The voltage distribution unit 213 outputs the distribution voltage to the voltage addition unit 212'.

The voltage addition unit 212' adds the distribution voltage from the voltage distribution unit 213 to the source voltage Vs to generate a sum voltage. The voltage addition unit 212' outputs the sum voltage to the comparator 211.

The comparator 211 receives the sum voltage via its positive input terminal and the gate voltage Vg via its negative input terminal. The comparator 211 generates a feedback signal based on a comparison between the sum voltage with the gate voltage Vg.

In one example, the comparator 211 outputs a positive feedback signal when the sum voltage is greater than the gate voltage Vg, but outputs a negative feedback signal when the sum voltage is less than or equal to the gate voltage Vg.

According to at least this example embodiment, because the comparator 211 compares the sum voltage from the voltage addition unit 212' with the gate voltage Vg, the comparator 211 outputs the negative feedback signal when the sum voltage is less than or equal to the gate voltage Vg. Accordingly, the power supply voltage providing unit 221 is turned off and does not apply the power supply voltage $V_{pp}$ to the driving voltage providing unit 222. In this case, the driving voltage providing unit 222 does not apply the power supply voltage $V_{pp}$ to the gate of the switching device 10 regardless of the state of the control signal CON. Therefore, the gate voltage Vg of the switching device 10 is maintained at a previous level without further increase.

According to at least this example embodiment, the control unit 20a turns off the driving voltage providing unit 222 before the gate voltage Vg reaches the same or substantially the same level as the sum voltage when the difference $\Delta V$ between the gate voltage Vg and the source voltage Vs of the switching device 10 increases. Thus, the control unit 20a may control the gate voltage Vg more quickly.

Figure 8:
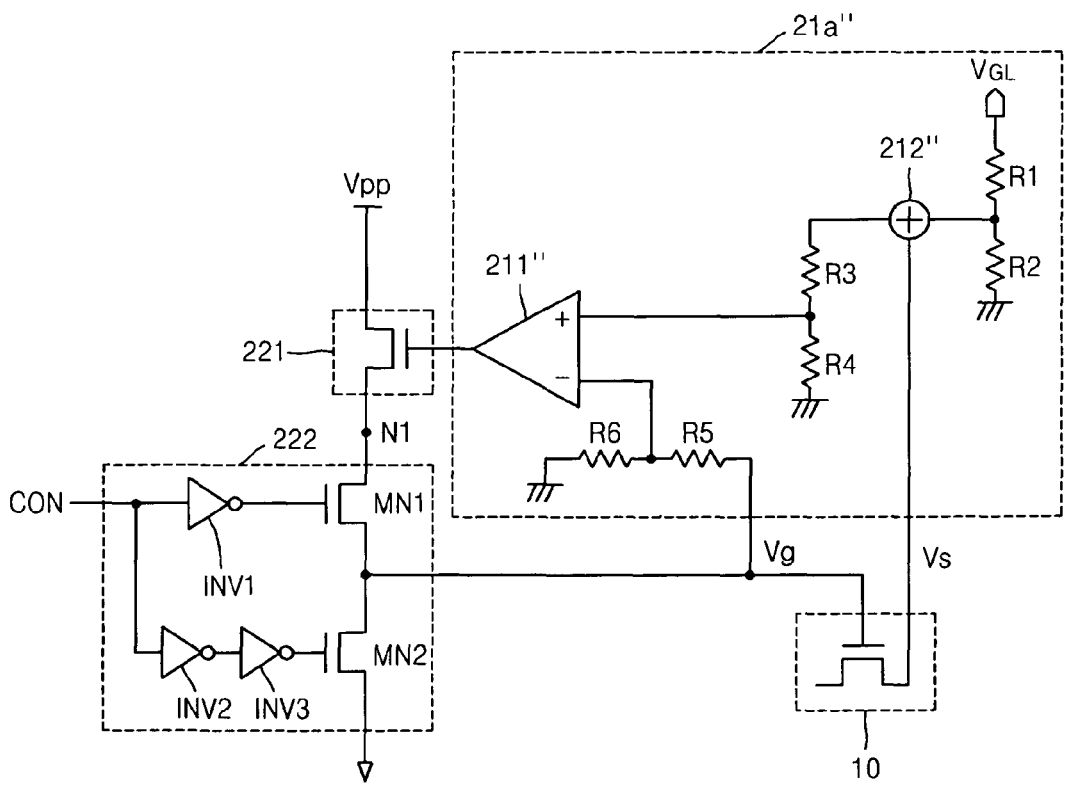
FIG. 8 is a schematic circuit diagram of yet another example embodiment of the control unit illustrated in FIG. 5.

FIG. 8 is a schematic circuit diagram of another example embodiment of the control unit 20a shown in FIG. 5.

Referring to FIG. 8, a feedback unit 21a" includes a comparator 211", a voltage addition unit 212" and first through sixth resistors R1 through R6. The first and second resistors R1 and R2 constitute a first voltage distribution unit, the third and fourth resistors R3 and R4 constitute a second voltage distribution unit, and the fifth and sixth resistors R5 and R6 constitute a third voltage distribution unit. The feedback unit 21a" according to this example embodiment is similar to the feedback unit 21a' of FIG. 7, and thus, a description of duplicate portions thereof will be omitted here.

The first voltage distribution unit R1 and R2 distributes the critical voltage $V_{GL}$ to output a first distribution voltage to the voltage addition unit 212". The first distribution voltage is lower than the critical voltage $V_{GL}$. The critical voltage $V_{GL}$ may be given, desired and/or predetermined based on the current-voltage characteristics of the switching device 10. The first distribution voltage is determined according to values of the first and second resistors R1 and R2.

The voltage addition unit 212" adds the first distribution voltage from the first voltage distribution unit R1 and R2 to the source voltage Vs to output a sum voltage.

The second voltage distribution unit R3 and R4 distributes the sum voltage from the voltage addition unit 212" to generate a second distribution voltage that is lower than the sum voltage. The second voltage distribution unit R3 and R4 outputs the second distribution voltage to the comparator 211". The second distribution voltage is determined according to values of the third and fourth resistors R3 and R4.

The third voltage distribution unit R5 and R6 distributes the gate voltage Vg to generate a third distribution voltage that is lower than the gate voltage Vg. The third distribution voltage is output to the comparator 211". The third distribution voltage is determined according to values of the fifth and sixth resistors R5 and R6.

The comparator 211" receives the second distribution voltage via its positive input terminal and receives the third distribution voltage via its negative input terminal. The comparator 211" generates a feedback signal based on a comparison between the second distribution voltage and the third distribution voltage. In one example, the comparator 211" outputs a positive feedback signal when the second distribution voltage is greater than the third distribution voltage, but outputs a negative feedback signal when the second distribution voltage is less than or equal to the third distribution voltage.

According to at least this example embodiment, the control unit 20a may detect the source voltage Vs and the gate voltage Vg more quickly because the second distribution voltage is lower than the sum voltage and the third distribution voltage is lower than the gate voltage Vg. Thus, the control unit 20a may control the gate voltage Vg more quickly.

Figure 9:
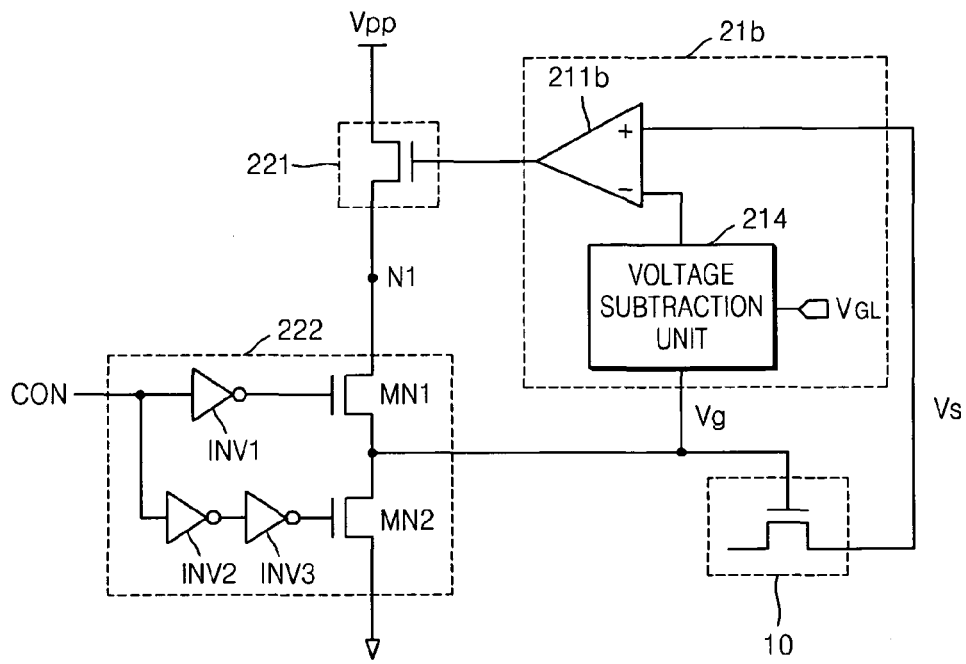
FIG. 9 is a schematic circuit diagram of still another example embodiment of the control unit illustrated in FIG. 5.

FIG. 9 is a schematic circuit diagram of another example embodiment of the control unit 20a shown in FIG. 5.

Referring to FIG. 9, a feedback unit 21b includes a comparator 211b and a voltage subtraction unit 214. The feedback unit 21b according to at least this example embodiment is similar to the feedback unit 21a in FIG. 6, and thus, a description of duplicate portions thereof will be omitted here. In FIG. 9, the feedback unit 21b includes the voltage subtraction unit 214 instead of the voltage addition unit 212 of the feedback unit 21a in FIG. 6.

The voltage subtraction unit 214 receives the gate voltage Vg and the critical voltage $V_{GL}$. The voltage subtraction unit 214 subtracts the critical voltage $V_{GL}$ from the gate voltage Vg to output a subtraction voltage. The critical voltage $V_{GL}$ may be given, desired and/or predetermined based on the current-voltage characteristics of the switching device 10.

The comparator 211b receives the source voltage Vs via its positive input terminal and receives the subtraction voltage via its negative input terminal. The comparator 211b compares the subtraction voltage with the source voltage Vs to generate a feedback signal. In one example, the comparator 211b outputs a positive feedback signal when the source voltage Vs is greater than the subtraction voltage, but outputs a negative feedback signal when the source voltage Vs is less than or equal to the subtraction voltage.

Figure 10:
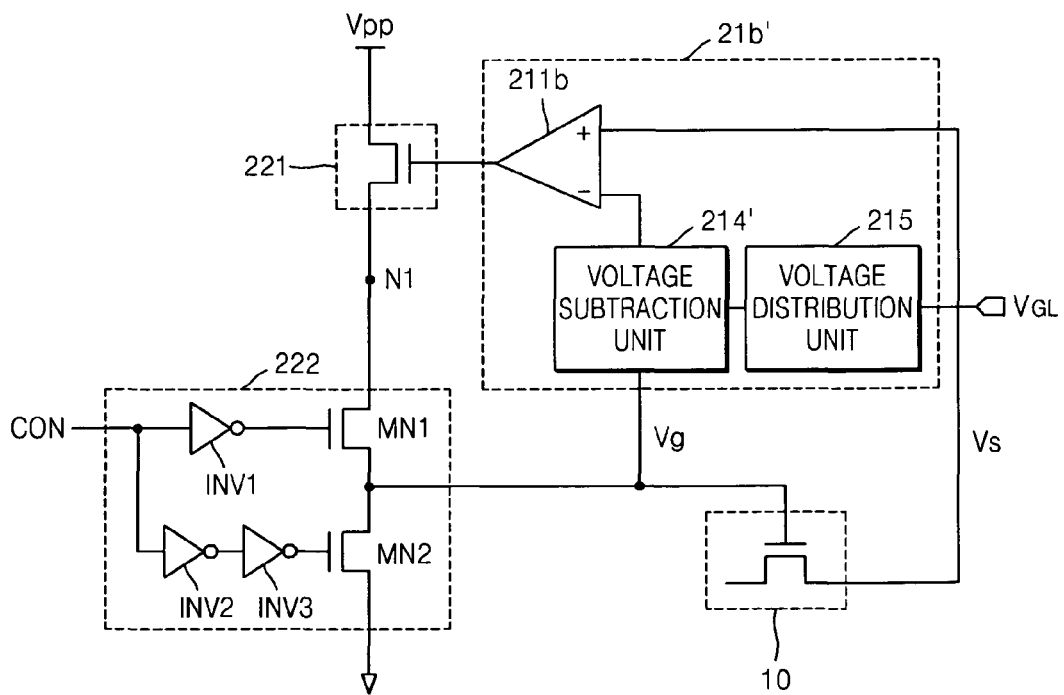
FIG. 10 is a schematic circuit diagram of a further example embodiment of the control unit illustrated in FIG. 5.

FIG. 10 is a schematic circuit diagram of another example embodiment of the control unit 20a shown in FIG. 5.

Referring to FIG. 10, a feedback unit 21b' includes a comparator 211b, a voltage subtraction unit 214' and a voltage distribution unit 215. The feedback unit 21b' is similar to the feedback unit 21b of FIG. 9, but further includes a voltage distribution unit 215. A description of duplicate portions thereof will be omitted here.

The voltage distribution unit 215 distributes the critical voltage $V_{GL}$ to output a distribution voltage that is lower than the critical voltage $V_{GL}$. The critical voltage $V_{GL}$ may be given, desired or pre-determined based on the current-voltage characteristics of the switching device 10. The voltage subtraction unit 214' subtracts the distribution voltage from the gate voltage Vg to output a subtraction voltage.

The comparator 211b receives the source voltage Vs via its positive input terminal and receives the subtraction voltage via its negative input terminal.

The comparator 211b compares the subtraction voltage with the source voltage Vs to generate a feedback signal. In one example, the comparator 211b outputs a positive feedback signal when the source voltage Vs is greater than the subtraction voltage, but outputs a negative feedback signal when the source voltage Vs is less than or equal to the subtraction voltage.

Figure 11:
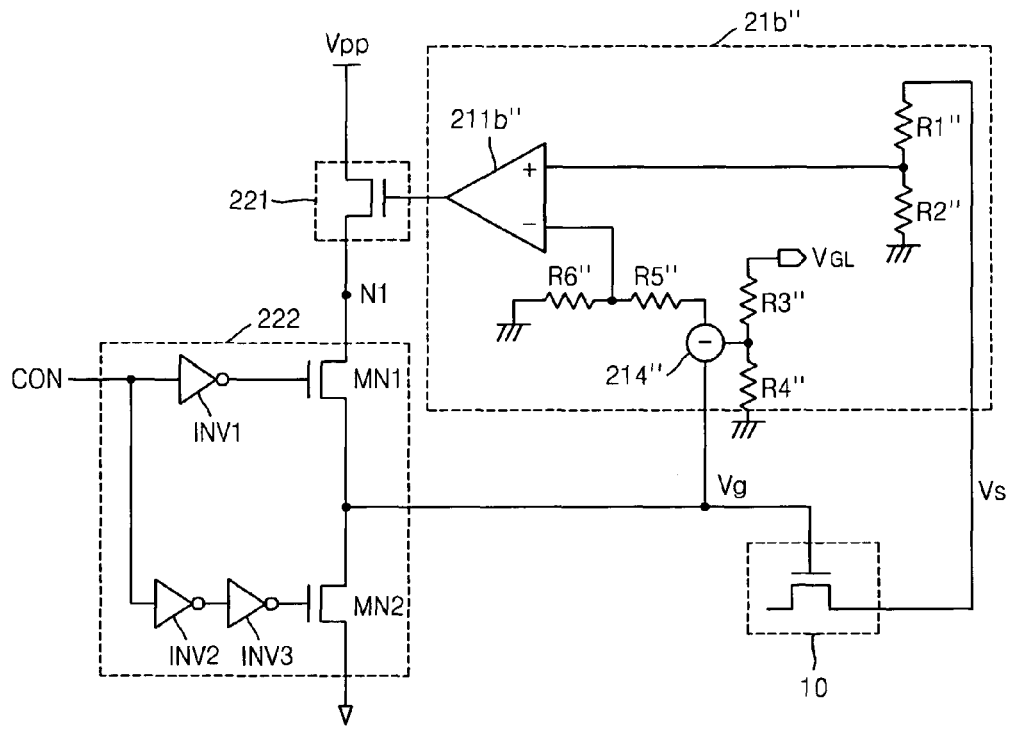
FIG. 11 is a schematic circuit diagram of another example embodiment of the control unit illustrated in FIG. 5.

FIG. 11 is a schematic circuit diagram of another example embodiment of the control unit 20a shown in FIG. 5.

Referring to FIG. 11, a feedback unit 21b" includes a comparator 211b", a voltage subtraction unit 214" and first through sixth resistors R1" through R6". The third and fourth resistors R3" and R4" constitute a first voltage distribution unit. The fifth and sixth resistors R5" and R6" constitute a second voltage distribution unit. The first and second resistors R1" and R2" constitute a third voltage distribution unit. The feedback unit 21b" according to at least this example embodiment is similar to the feedback unit 21b' of FIG. 10, and thus, a description of duplicate portions thereof will be omitted here.

The first voltage distribution unit R3" and R4" distributes the critical voltage $V_{GL}$ to generate a first distribution voltage that is lower than the critical voltage $V_{GL}$. The critical voltage $V_{GL}$ may be given, desired or predetermined based on the current-voltage characteristics of the switching device 10. The first distribution voltage is determined according to values of the third and fourth resistors R3" and R4".

The voltage subtraction unit 214" subtracts the first distribution voltage from the gate voltage Vg to output a subtraction voltage.

The second voltage distribution unit R5" and R6" distributes the subtraction voltage to generate a second distribution voltage that is lower than the subtraction voltage. The second distribution voltage is determined according to values of the fifth and sixth resistors R5" and R6".

The third voltage distribution unit R1" and R2" distributes the source voltage Vs to generate a third distribution voltage that is lower than the source voltage Vs. The third distribution voltage is determined according to values of the first and second resistors R1" and R2".

The comparator 211b" receives the third distribution voltage via its positive input terminal and the second distribution voltage via its negative input terminal. The comparator 211b" generates a feedback signal based on a comparison between the second distribution voltage and the third distribution voltage. In one example, the comparator 211b" outputs a positive feedback signal when the third distribution voltage is greater than the second distribution voltage, but outputs a negative feedback signal when the third distribution voltage is less than the second distribution voltage.

Figure 12:
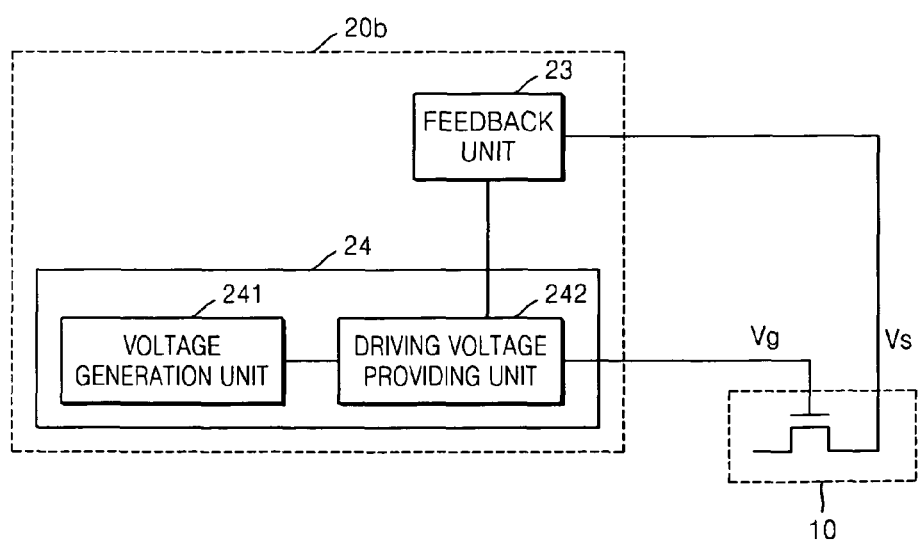
FIG. 12 is a schematic block diagram of the control unit illustrated in FIG. 4 according to another example embodiment.

FIG. 12 is a schematic block diagram of another example embodiment of the control unit 20 of FIG. 4.

Referring to FIG. 12, the control unit 20b includes a feedback unit 23 and a driving unit 24. The driving unit 24 includes a voltage generation unit 241 and a driving voltage providing unit 242. Example operation of the control unit 20b will now be described in more detail.

The feedback unit 23 detects the source voltage Vs of the switching device 10 and generates a feedback signal based on the source voltage Vs. The feedback unit 23 applies the feedback signal to the driving unit 24. The feedback signal may be a pulse signal including a plurality of pulses that are sequentially turned on/off as the source voltage Vs increases.

The voltage generation unit 241 includes a plurality of voltage generation units (not shown in FIG. 12) to generate a plurality of voltages having different levels. The driving voltage providing unit 242 applies a selected one of the plurality of voltages generated by the voltage generation unit 241 to the gate of the switching device 10 based on the feedback signal from the feedback unit 23. In this example, the driving voltage may have a multi-step waveform in which at least one of a width and a height of each step varies based on the pulses of the feedback signal.

Based on a plurality of pulses that are sequentially turned on/off as the source voltage Vs increases, the driving unit 20b determines a time at which a voltage corresponding to the next level (e.g., the next step with respect to the current step in the driving voltage having the multi-step waveform) is applied. Thus, the rising time (the increasing inclination) of the gate voltage Vg may be adaptively controlled according to the source voltage Vs. Consequently, generation of leakage current between the gate and the source of the switching device 10 may be suppressed and/or prevented.

Figure 13:
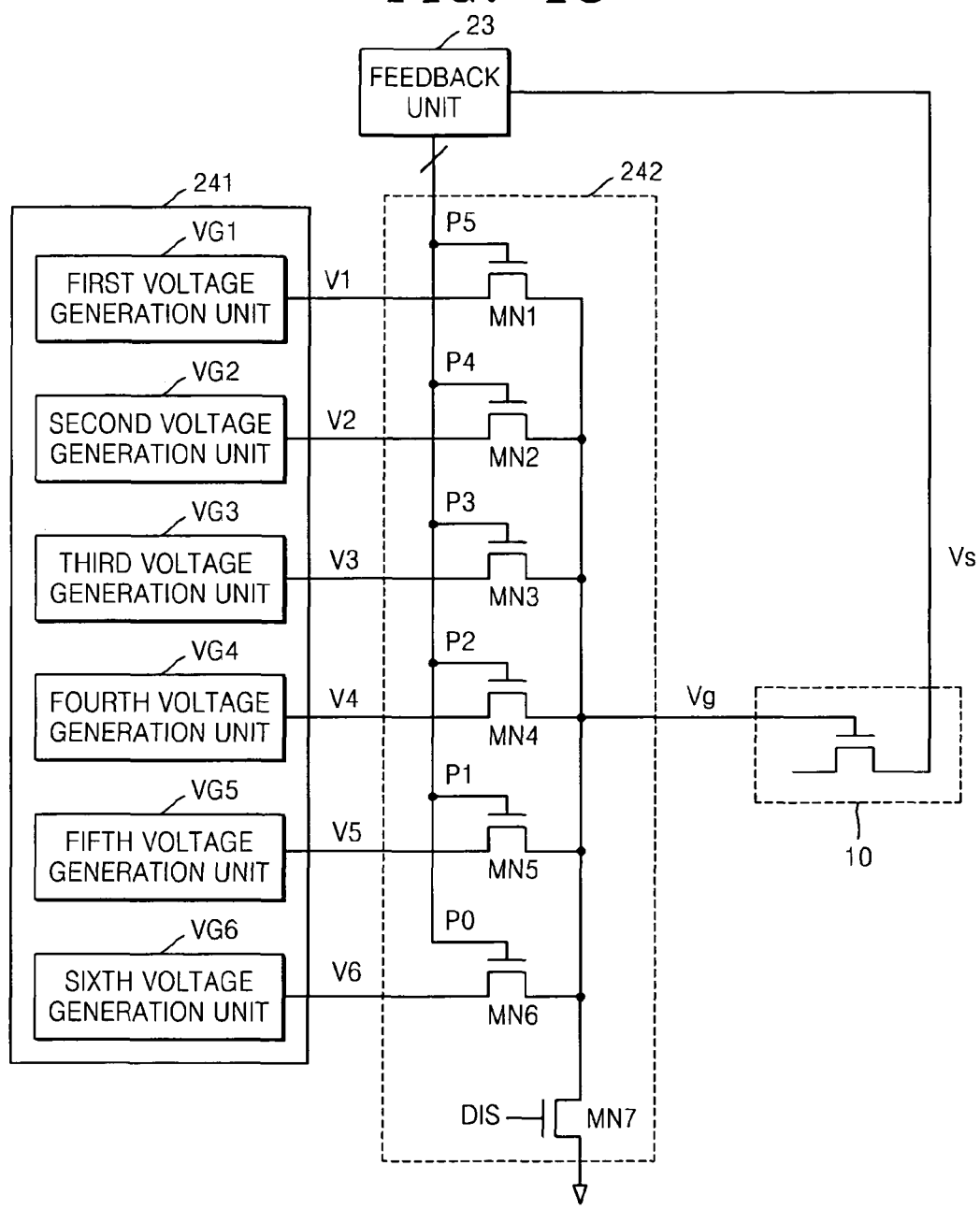
FIG. 13 is a more detailed schematic block diagram of an example embodiment of the control unit shown in FIG. 12.

FIG. 13 is a more detailed schematic block diagram of an example embodiment of the control unit shown in FIG. 12.

Referring to FIG. 13, the feedback unit 23 detects the source voltage Vs and generates a feedback signal based on the detected source voltage Vs. The feedback signal may be an N-bit pulse signal (P<0:(N−1)>). For example, the feedback signal may be a 6-bit pulse signal (P<0:5>) including first through sixth pulses P0 through P5. However, this is just an example, and the feedback signal may be a pulse signal having bits, the number of which varies.

The voltage generation unit 241 includes first through sixth voltage generation units VG1 through VG6. The first through sixth voltage generation units VG1 through VG6 generate first through sixth voltages V1 through V6, respectively. The first through sixth voltages V1 through V6 may have different values. For example, the first voltage V1 may be about 300 V, the second voltage V2 may be about 250 V, the third voltage V3 may be about 200 V, the fourth voltage V4 may be about 150 V, the fifth voltage V5 may be about 100 V, and the sixth voltage V6 may be about 50 V.

The driving voltage providing unit 242 includes first through seventh NMOS transistors MN1 through MN7. The gate of each of the first through sixth NMOS transistors MN1 through MN6 receives a pulse signal. In more detail, the gate of the first NMOS transistor MN1 receives the sixth pulse P5, the gate of the second NMOS transistor MN2 receives the fifth pulse P4, the gate of the third NMOS transistor MN3 receives the fourth pulse P3, the gate of the fourth NMOS transistor MN4 receives the third pulse P2, the gate of the fifth NMOS transistor MN5 receives the second pulse P1, and the gate of the sixth NMOS transistor MN6 receives the first pulse P0.

Drains of the first through sixth NMOS transistors MN1 through MN6 are connected to the first through sixth voltage generation units VG1 through VG6, respectively, to receive a respective one of the first through sixth voltages V1 through V6.

Sources of the first through sixth NMOS transistors MN1 through MN6 are commonly connected to the gate of the switching device 10.

Still referring to FIG. 13, the seventh NMOS transistor MN7 has a drain connected to the gate of the switching device 10, a gate to which a discharge signal DIS is applied, and a source connected to a ground terminal. The seventh NMOS transistor MN7 is turned on when the discharge signal DIS is enabled, thereby providing a ground voltage to the gate of the switching device 10. In this case, the gate voltage Vg is ground.

Figure 14:
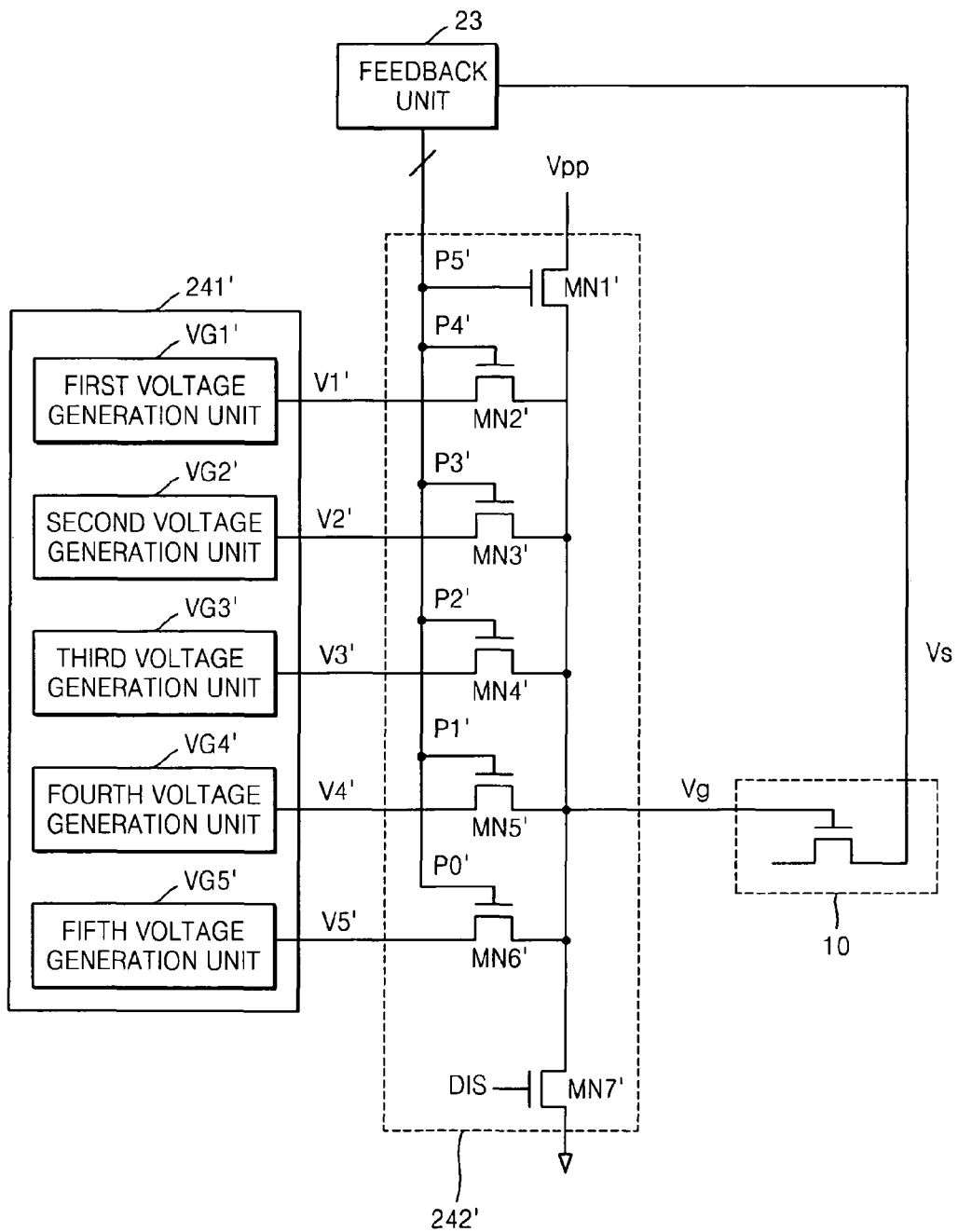
FIG. 14 is a more detailed schematic block diagram of another example embodiment of the control unit shown in FIG. 12.

FIG. 14 is a more detailed schematic block diagram of another example embodiment of the control unit 20b shown in FIG. 12.

Referring to FIG. 14, the feedback unit 23 detects the source voltage Vs and generates a feedback signal based on the detected source voltage Vs. The feedback signal may be an N-bit pulse signal (P<0:(N−1)>). For example, the feedback signal may be a 6-bit pulse signal (P<0:5>) including first through sixth pulses P0' through P5'. However, this is just an example, and the feedback signal may be a pulse signal having bits, the number of which varies, in other example embodiments.

A voltage generation unit 241' includes first through fifth voltage generation units VG1' through VG5'. Each of the first through fifth voltage generation units VG1' through VG5' generates a corresponding one of first through fifth voltages V1' through V5'. The first through fifth voltages V1' through V5' may have different values. For example, the first voltage V1' may be about 250 V, the second voltage V2' may be about 200 V, the third voltage V3' may be about 150 V, the fourth voltage V4' may be about 100 V, and the fifth voltage V5' may be about 50 V.

A driving voltage providing unit 242' includes first through seventh NMOS transistors MN1' through MN7'. The gate of each of the first through sixth NMOS transistors MN1' through MN6' receives a pulse signal. In more detail, the gate of the first NMOS transistor MN1' receives the sixth pulse P5', the gate of the second NMOS transistor MN2' receives the fifth pulse P4', the gate of the third NMOS transistor MN3' receives the fourth pulse P3', the gate of the fourth NMOS transistor MN4' receives the third pulse P2', the gate of the fifth NMOS transistor MN5' receives the second pulse P1', and the gate of the sixth NMOS transistor MN6' receives the first pulse P0'.

A drain of the first NMOS transistor MN1' receives the power supply voltage $V_{pp}$. The power supply voltage $V_{pp}$ may have a voltage level higher than the first voltage V1'. Drains of the second through sixth NMOS transistors MN2' through MN6' are connected to the first through fifth voltage generation units VG1' through VG5', respectively, to receive a respective one of the first through fifth voltage V1' through V5'.

Sources of the first through sixth NMOS transistors MN1' through MN6' are commonly connected to the gate of the switching device 10.

The seventh NMOS transistor MN7' has a drain connected to the gate of the switching device 10, a gate to which a discharge signal DIS is applied, and a source connected to a ground terminal. The seventh NMOS transistor MN7' is turned on when the discharge signal DIS is enabled, thereby applying a ground voltage to the gate of the switching device 10. In this case, the gate voltage Vg is ground.

Figure 15:
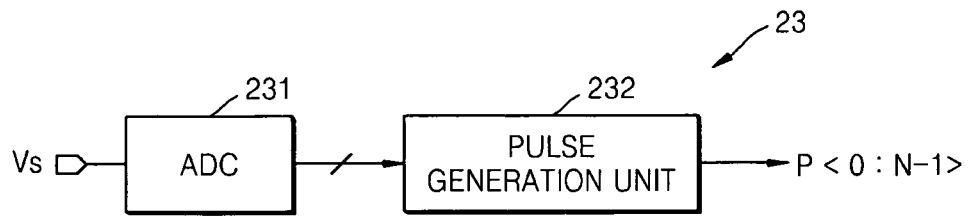
FIG. 15 is a detailed block diagram of the feedback unit illustrated in FIG. 13.

FIG. 15 is a block diagram of an example embodiment of the feedback unit 23.

Referring to FIG. 15, the feedback unit 23 includes an analog-to-digital converter (ADC) 231 and a pulse generation unit 232.

The ADC 231 receives the source voltage Vs and converts the source voltage Vs from an analog value to a digital value. The pulse generation unit 232 generates, as the feedback signal, a pulse signal having N bits (P<0:N−1>) that are each turned on/off according to the digital value output by the ADC 231.

When generating the pulse signal, the pulse generation unit 232 controls the width of each of the pulses included in the pulse signal to be inversely proportional to the inclination of the source voltage Vs. For example, if the source voltage Vs increases relatively slowly (if the inclination of the source voltage Vs is relatively small), the pulse generation unit 232 increases the width of each pulse of the pulse signal. As a result, the gate voltage Vg increases relatively slowly. On the other hand, if the source voltage Vs increases relatively rapidly (if the inclination of the source voltage Vs is relatively large), the pulse generation unit 232 decreases the width of each pulse of the pulse signal. In this case, the gate voltage Vg increases relatively rapidly.

Figure 16:
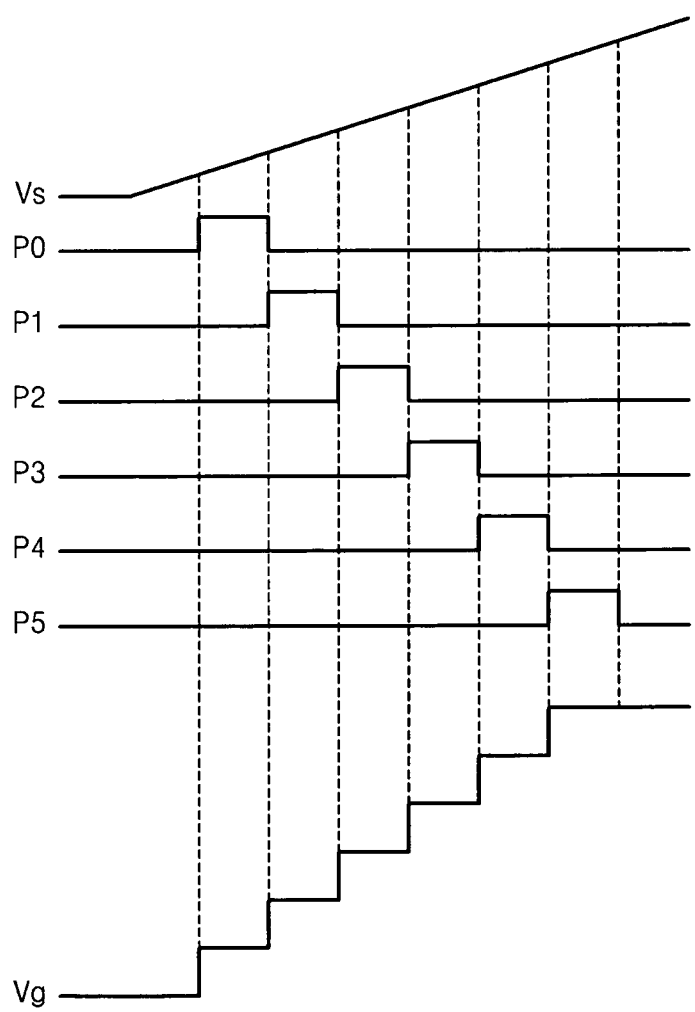
FIG. 16 is an example timing diagram of a source voltage, a feedback signal, and a gate voltage illustrated in FIG. 13.

FIG. 16 is an example timing diagram of the source voltage Vs, the feedback signal, and the gate voltage Vg in an example embodiment of the control unit shown in FIG. 13.

Referring to FIGS. 13, 15 and 16, the feedback unit 23 generates a 6-bit pulse signal (P<0:5>) including first through sixth pulses P0 through P5.

When the source voltage Vs increases to a given, desired or predetermined level, the pulse generation unit 232 generates a pulse signal in which the first pulse P0 is logic '1', but the second through sixth pulses P1 through P5 are logic '0'. In this case, the sixth NMOS transistor MN6 is turned on, whereas the first through fifth NMOS transistors MN1 through MN5 are turned off, so that the driving voltage providing unit 242 applies the sixth voltage V6 to the gate of the switching device 10. As mentioned above, the sixth voltage V6 may be about 50 V. In this case, the gate voltage Vg may be about 50 V.

When the source voltage Vs further increases, the pulse generation unit 232 generates a pulse signal in which the second pulse P1 is logic '1', but the first pulse P0 and the third through sixth pulses P2 through P5 are logic '0'. In this case, the fifth NMOS transistor MN5 is turned on, whereas the first through fourth NMOS transistors MN1 through MN4 and the sixth NMOS transistor MN6 are turned off, so that the driving voltage providing unit 242 applies the fifth voltage V5 to the gate of the switching device 10. As mentioned above, the fifth voltage V5 may be about 100 V. In this case, the gate voltage Vg may be about 100 V.

When the source voltage Vs further increases, the pulse generation unit 232 generates a pulse signal in which the third pulse P2 is logic '1', but the first and second pulses P0 and P1 and the fourth through sixth pulses P3 through P5 are logic '0'. In this case, the fourth NMOS transistor MN4 is turned on, whereas the first through third NMOS transistors MN1 through MN3 and the fifth and sixth NMOS transistors MN5 and MN6 are turned off, so that the driving voltage providing unit 242 applies the fourth voltage V4 to the gate of the switching device 10. As mentioned above, the fourth voltage V4 may be about 150 V. In this case, the gate voltage Vg may be about 150 V.

When the source voltage Vs further increases, the pulse generation unit 232 generates a pulse signal in which the fourth pulse P3 is logic '1', but the first through third pulses P0 through P2 and the fifth and sixth pulses P4 and P5 are logic '0'. In this case, the third NMOS transistor MN3 is turned on, whereas the first and second NMOS transistors MN1 and MN2 and the fourth through sixth NMOS transistors MN4 through MN6 are turned off, so that the driving voltage providing unit 242 applies the third voltage V3 to the gate of the switching device 10. As mentioned above, the third voltage V3 may be about 200 V. In this case, the gate voltage Vg may be about 200 V.

When the source voltage Vs further increases, the pulse generation unit 232 generates a pulse signal in which the fifth pulse P4 is logic '1', but the first through fourth pulses P0 through P3 and the sixth pulse P5 are logic '0'. In this case, the second NMOS transistor MN2 is turned on, whereas the first NMOS transistor MN1 and the third through sixth NMOS transistors MN3 through MN6 are turned off, so that the driving voltage providing unit 242 applies the second voltage V2 to the gate of the switching device 10. As mentioned above, the second voltage V2 may be about 250 V. In this case, the gate voltage Vg may be about 250 V.

When the source voltage Vs further increases, the pulse generation unit 232 generates a pulse signal in which the sixth pulse P5 is logic '1', but the first through fifth pulses P0 through P4 are logic '0'. In this case, the first NMOS transistor MN1 is turned on, whereas the second through sixth NMOS transistors MN2 through MN6 are turned off, so that the driving voltage providing unit 242 applies the first voltage V1 to the gate of the switching device 10. As mentioned above, the first voltage V1 may be about 300 V. In this case, the gate voltage Vg may be about 300 V.

According to at least this example embodiment, the feedback unit 23 generates a pulse signal in which the first through sixth pulses P0 through P5 are changed with an increase of the source voltage Vs, and the driving voltage providing unit 242 applies a voltage corresponding to the logic level of the pulse signal to the gate of the switching device 10. In at least this example embodiment, the gate voltage Vg of the switching device 10 may be a multi-step waveform in which a voltage level increases in stages according to a variation in the source voltage Vs.

Figure 17:
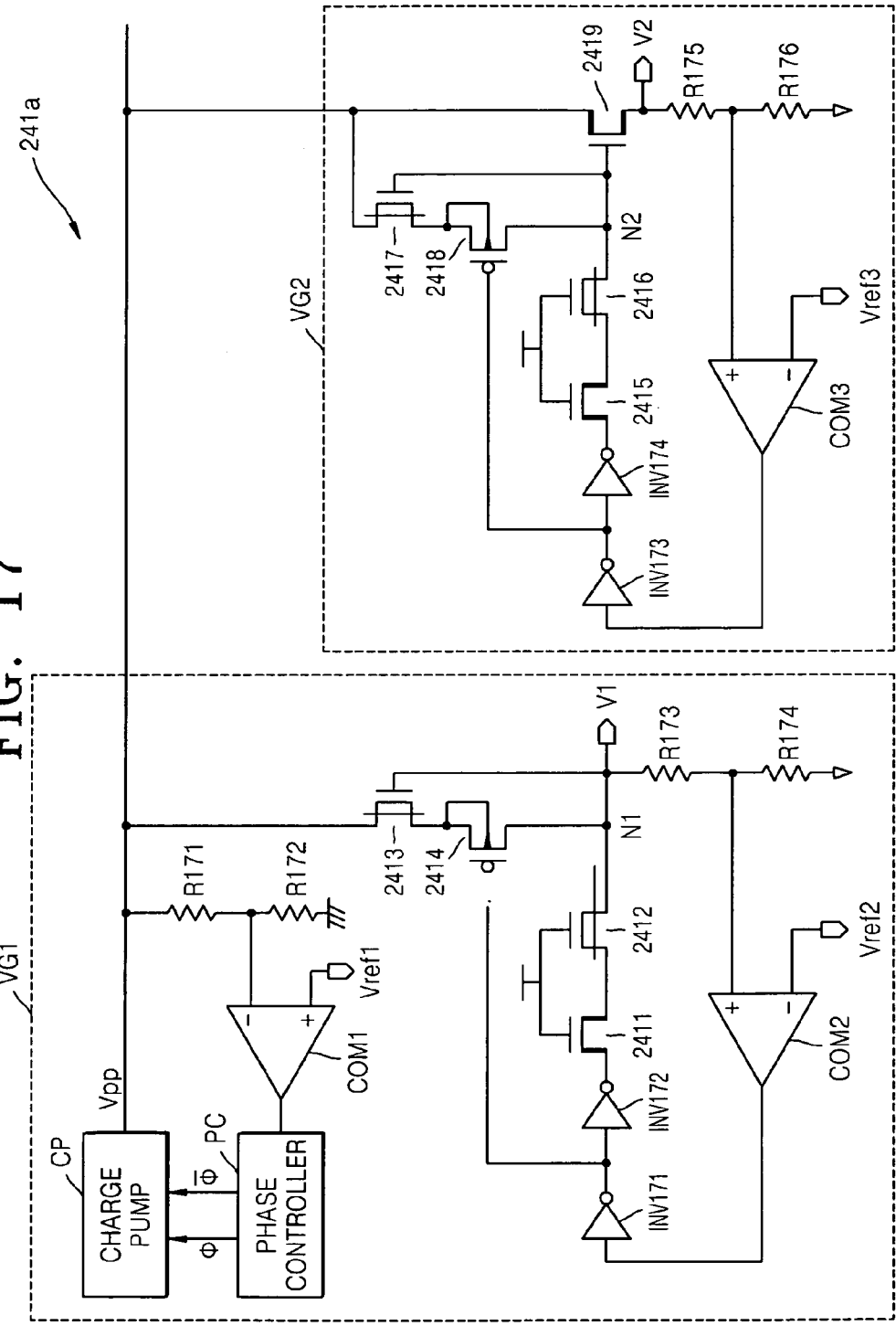
FIG. 17 is a circuit diagram illustrating an example embodiment of the voltage generation unit shown in FIG. 13.

FIG. 17 is a circuit diagram of an example embodiment of the voltage generation unit 241 shown in FIG. 13.

In FIG. 17, although the voltage generation unit 241a includes first through sixth voltage generation units VG1 through VG6, only the first and second voltage generation units VG1 and VG2 are illustrated for convenience of explanation. The third through sixth voltage generation units VG3 through VG6 may be implemented in a manner similar or substantially similar to the second voltage generation unit VG2. The structure of the voltage generation unit 241a described below is only an example, and the structure of the voltage generation unit 241 is not limited thereto.

The first voltage generation unit VG1 includes: a charge pump CP; a phase controller PC; first and second comparators COM1 and COM2; first through fourth resistors R171 through R174; first and second inverters INV171 and INV172; first through third NMOS transistors 2411, 2412, and 2413; and a first PMOS transistor 2414. The first NMOS transistor 2411 may be a high voltage NMOS transistor, and the second and third NMOS transistors 2412 and 2413 may be depletion-mode NMOS transistors.

The power supply voltage $V_{pp}$ is distributed according to the values of the first and second resistors R171 and R172. The first comparator COM1 generates a first comparison signal based on a comparison between a voltage at the second resistor R172 and a first reference voltage Vref1. When the voltage at the second resistor R172 is greater than the first reference voltage Vref1, the first comparator COM1 generates a negative first comparison signal. When the voltage at the second resistor R172 is less than or equal to the first reference voltage Vref1, the first comparator COM1 generates a positive first comparison signal.

The phase controller PC outputs a control phase ϕ or an inverted control phase ϕ' based on the first comparison signal. In response to the positive first comparison signal, the phase controller PC increases a duration during which the charge pump CP is enabled. In response to the negative first comparison signal, the phase controller PC decreases the duration during which the charge pump CP is enabled.

The charge pump CP generates the power supply voltage $V_{pp}$ based on the control phase ϕ or the inverted control phase ϕ'. If the duration during which the charge pump CP is enabled increases, the voltage level of the power supply voltage $V_{pp}$ increases. If the duration when the charge pump CP is enabled decreases, the voltage level of the power supply voltage $V_{pp}$ decreases.

Still referring to FIG. 17, a first voltage V1 is distributed according to the values of the third and fourth resistors R173 and R174. The second comparator COM2 generates a second comparison signal based on a comparison between a voltage at the fourth resistor R174 and a second reference voltage Vref2. When the voltage at the fourth resistor R174 is greater than the second reference voltage Vref2, the second comparator COM2 generates a positive second comparison signal. When the voltage at the fourth resistor R174 is less than or equal to the second reference voltage Vref2, the second comparator COM2 generates a negative second comparison signal.

The first inverter INV171 inverts the second comparison signal to generate an inverted second comparison signal. The second inverter INV172 inverts an output of the first inverter INV171 to restore the second comparison signal. The first PMOS transistor 2414 is turned on/off according to the output of the first inverter INV171 to provide the power supply voltage $V_{pp}$ to a first node N1. The voltage at the first node N1 is the first voltage V1. In this example, the first and second inverters INV171 and INV172 and the second comparator COM2, which operate at a relatively low voltage, may be protected from the power supply voltage $V_{pp}$ because the first through third NMOS transistors 2411, 2412, and 2413 are capable of enduring a relatively high voltage.

The second voltage generation unit VG2 includes: a third comparator COM3; fifth and sixth resistors R175 and R176; third and fourth inverters INV173 and INV174; fourth through seventh NMOS transistors 2415, 2416, 2417, and 2419; and a second PMOS transistor 2418. The fourth and seventh NMOS transistors 2415 and 2419 may be high voltage NMOS transistors, whereas the fifth and sixth NMOS transistors 2416 and 2417 may be depletion-mode NMOS transistors.

A second voltage V2 is distributed according to the values of the fifth and sixth resistors R175 and R176. The third comparator COM3 generates a third comparison signal based on a comparison between a voltage at the sixth resistor R176 and a third reference voltage Vref3.

When the voltage at the sixth resistor R176 is greater than the third reference voltage Vref3, the third comparator COM3 generates a positive third comparison signal. When the voltage at the sixth resistor R176 is less than or equal to the third reference voltage Vref3, the third comparator COM3 generates a negative third comparison signal.

The third inverter INV173 inverts the third comparison signal to generate an inverted third comparison signal. The fourth inverter INV174 inverts an output of the third inverter INV173 to restore the third comparison signal. The second PMOS transistor 2418 is turned on/off according to the output of the third inverter INV173 to selectively provide the power supply voltage $V_{pp}$ to a second node N2. The seventh NMOS transistor 2419 is turned on/off according to a voltage of the second node N2 to selectively provide the power supply voltage $V_{pp}$ to a terminal of the second voltage V2. In this example, the third and fourth inverters INV173 and INV174 and the third comparator COM3, which operate at a relatively low voltage, may be protected from the power supply voltage $V_{pp}$ because the fourth through sixth NMOS transistors 2415, 2416, and 2417 are capable of enduring a relatively high voltage.

Figure 18:
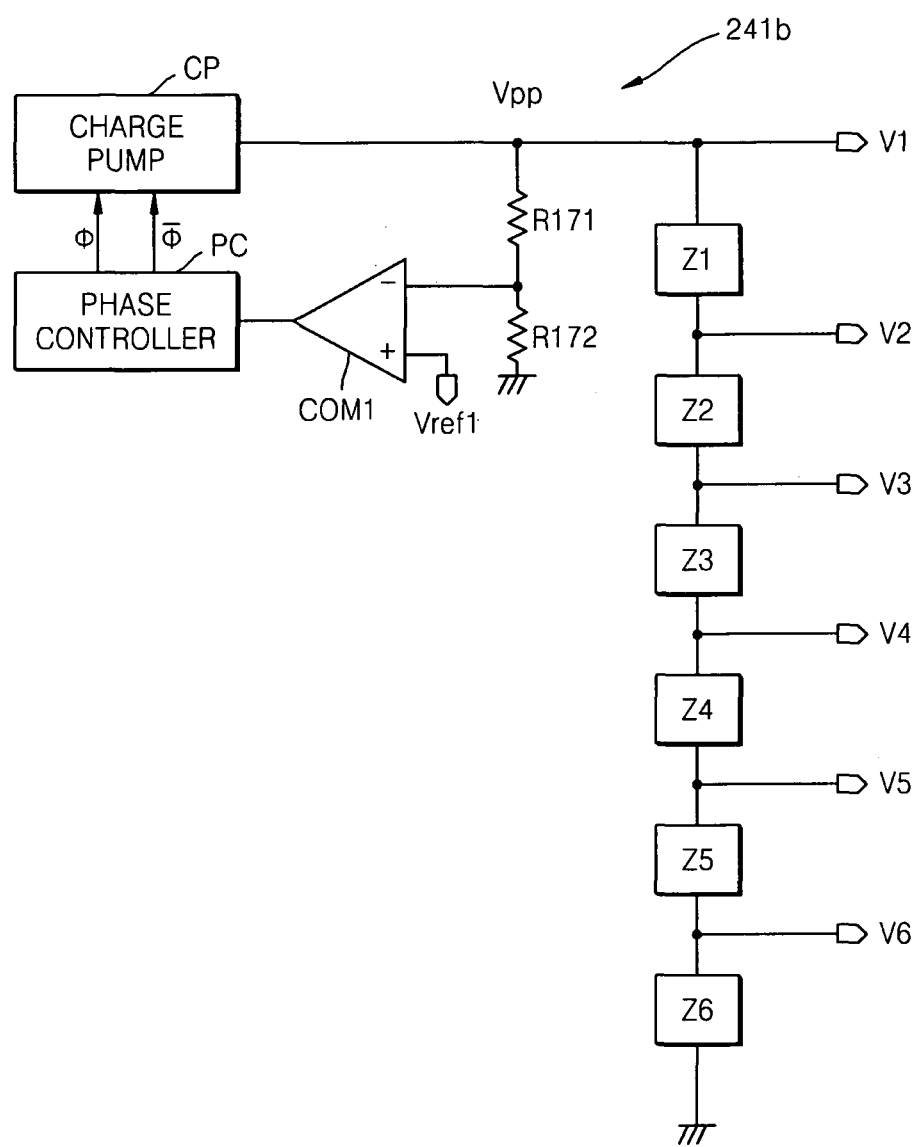
FIG. 18 is a circuit diagram illustrating another example embodiment of the voltage generation unit shown in FIG. 13.

FIG. 18 is a circuit diagram of another example embodiment of the voltage generation unit 241 shown FIG. 13.

Referring to FIG. 18, the voltage generation unit 241b includes: a charge pump CP; a phase controller PC; a first comparator COM1; first and second resistors R171 and R172, and first through sixth passive devices Z1 through Z6. The voltage generation unit 241b according to at least this example embodiment is somewhat similar to the voltage generation unit 241a shown in FIG. 17. Thus, a description of a duplicate portions thereof will be omitted here. A structure of the voltage generation unit 241b, which is to be described below, is only an example embodiment, and the structure of the voltage generation unit 241b is not limited thereto.

The power supply voltage $V_{pp}$ generated by the charge pump CP is distributed by the first through sixth passive devices Z1 through Z6 to generate first through sixth voltages V1 through V6. The first through sixth voltages V1 through V6 are determined according to the impedances of the first through sixth passive devices Z1 through Z6. Thus, the first through sixth voltages V1 through V6 may be adjusted and/or changed by changing the impedances of the first through sixth passive devices Z1 through Z6.

Figure 19:
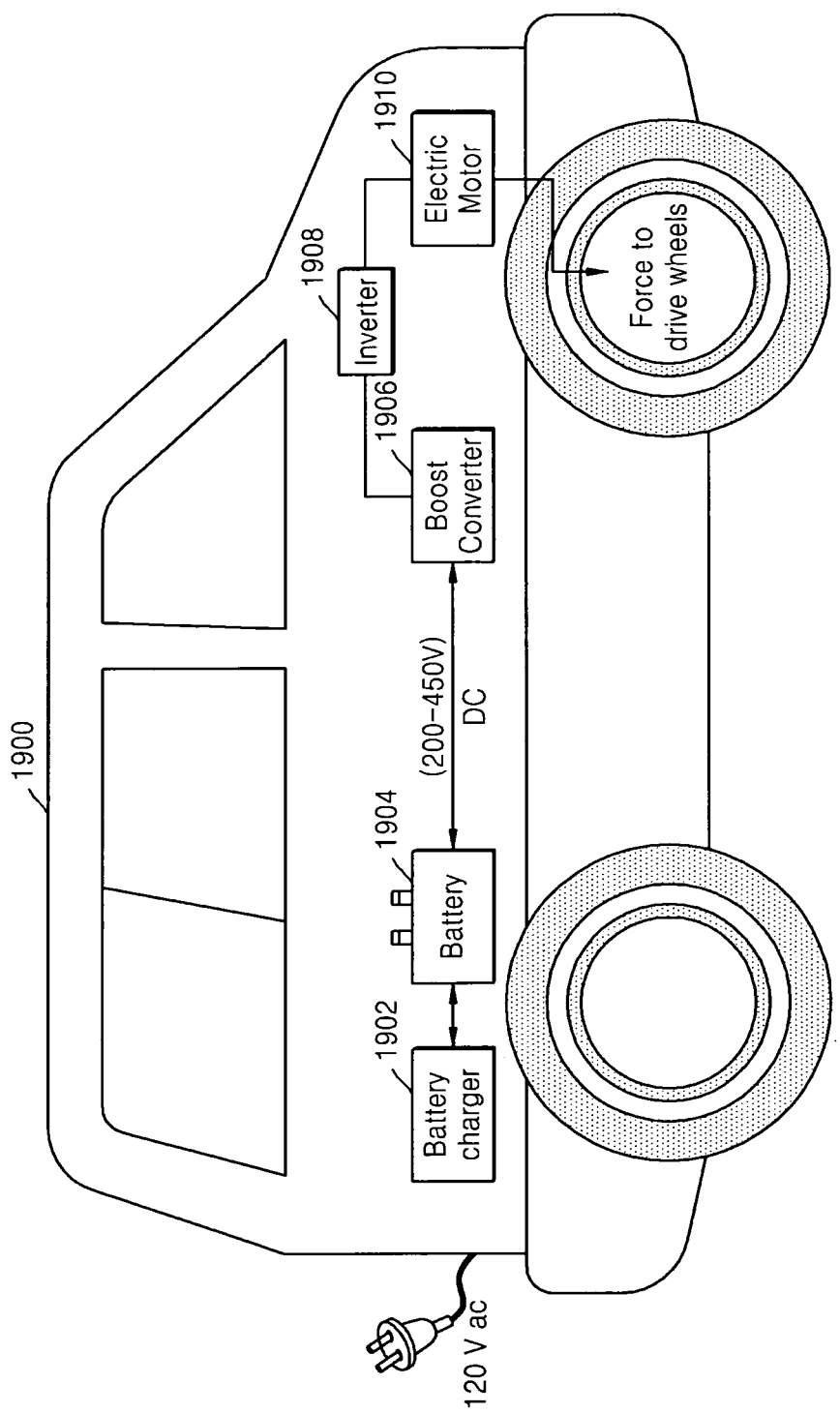
FIG. 19 illustrates an electric vehicle including a power device according to an example embodiment.

FIG. 19 illustrates an electric vehicle including a power device according to an example embodiment.

Referring to FIG. 19, the electric vehicle 1900 includes a battery charger 1902 configured to be plugged into a conventional wall outlet (e.g., 120V outlet) to charge a battery 1904. The battery 1904 provides power to drive the wheels of the vehicle 1900.

In more detail, the battery 1904 provides a power supply voltage to the boost converter 1906. The boost converter 1906 is configured to step-up the input voltage from the battery 1904 when the electric vehicle requires a higher operating voltage than is capable of being applied by the battery 1904. The boost converter 1906 outputs the stepped-up voltage to the inverter 1908.

The inverter 1908 is configured to convert the direct current (DC) from the boost converter 1906 to alternating current (AC) to provide phased power for vehicle traction motors and/or generators. The inverter 1908 outputs the AC power to an electric motor 1910.

The electric motor 1910 drives the wheels of the electric vehicle 1900 using the power from the inverter 1908.

With regard to the electric vehicle 1900 shown in FIG. 19, power devices described above with regard to FIGS. 1-18 may be utilized as, or as a component of, the boost converter 1906 and/or inverter 1908.

Figure 20:
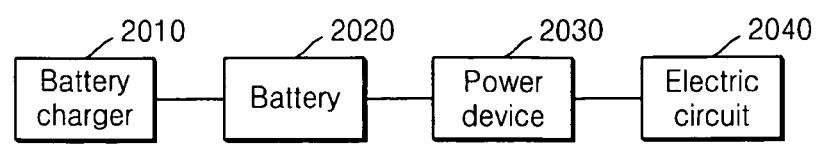
FIG. 20 illustrates an electric device including a power device according to an example embodiment.

FIG. 20 illustrates an electric device including a power device according to an example embodiment.

Referring to FIG. 20, the electric device 2000 includes a battery charger 2010, a battery 2020, a power device 2030 and an electric circuit 2040. The battery charger 2010 and the battery 2020 may be implemented substantially similar to the battery charger 1902 and the battery 1904 illustrated in FIG. 19.

In more detail, the battery 2020 provides a supply voltage to the power device 2030. The power device 2030 generates a power supply voltage by at least one of up-converting, down-converting and inverting the supply voltage from the battery. The power device 2030 may include the power devices described previously with regard to FIGS. 1-18 as a component. The electric circuit receives the power supply voltage and operates according to the power supply voltage.

It should be understood that the example embodiments described herein should be considered in a descriptive sense only and not for purposes of limitation. Descriptions of features or aspects within each example embodiment should typically be considered as available for other similar features or aspects in other example embodiments.

What is claimed is:

1. A power device comprising:
   a switching device having a control terminal and an output terminal; and
   a control unit configured to control a rising time required for a driving voltage to reach a target level such that a voltage between the control terminal and the output terminal is maintained less than or equal to a critical voltage, wherein
      when the voltage between the control terminal and the output terminal is greater than the critical voltage, leakage current is generated between the control terminal and the output terminal,
      the driving voltage is a voltage for controlling the switching device, and
      the control unit is configured to control the rising time of the driving voltage based on a voltage at the output terminal.

2. The power device of claim 1, wherein the control unit is configured to increase the rising time of the driving voltage based on the voltage at the output terminal.

3. The power device of claim 1, wherein the control unit comprises:
- a feedback unit configured to generate a feedback signal based on a difference between the voltage at the output terminal and the driving voltage; and
- a driving unit configured to selectively apply the driving voltage to the control terminal based on the feedback signal.

4. The power device of claim 3, wherein the driving unit comprises:
- a power supply voltage providing unit configured to provide a power supply voltage to a first node based on the feedback signal; and
- a driving voltage providing unit configured to apply one of a voltage at the first node and a ground voltage to the control terminal based on a control signal received from an external source.

5. The power device of claim 4, wherein the feedback unit is configured to provide a positive feedback signal to decrease the rising time of the driving voltage and provide a negative feedback signal to increase the rising time of the driving voltage.

6. The power device of claim 5, wherein the power supply voltage providing unit is configured to provide the power supply voltage to the first node when the positive feedback signal is provided, but not when the negative feedback signal is provided.

7. The power device of claim 3, wherein the feedback unit comprises:
- a voltage addition unit configured to add the voltage at the output terminal to the critical voltage to generate a sum voltage; and
- a comparator configured to generate the feedback signal based on a comparison between the sum voltage and the driving voltage,
- wherein the comparator generates a positive feedback signal when the sum voltage is greater than the driving voltage, and
- the comparator generates a negative feedback signal when the sum voltage is less than or equal to the driving voltage.

8. The power device of claim 3, wherein the feedback unit comprises:
- a voltage distribution unit configured to generate a distribution voltage by distributing the critical voltage, the distribution voltage having a voltage level less than the critical voltage;
- a voltage addition unit configured to add the voltage at the output terminal to the distribution voltage to generate a sum voltage; and
- a comparator configured to generate the feedback signal based on a comparison between the sum voltage and the driving voltage,
- wherein the comparator generates a positive feedback signal when the sum voltage is greater than the driving voltage, and
- the comparator generates a negative feedback signal when the sum voltage is less than or equal to the driving voltage.

9. The power device of claim 3, wherein the feedback unit comprises:
- a first voltage distribution unit configured to generate a first distribution voltage by distributing the critical voltage, the first distribution voltage having a voltage level less than the critical voltage;
- a voltage addition unit configured to add the voltage at the output terminal to the first distribution voltage to generate a sum voltage;
- a second voltage distribution unit configured to generate a second distribution voltage by distributing the sum voltage, the second distribution voltage having a voltage level less than the sum voltage;
- a third voltage distribution unit configured to generate a third distribution voltage by distributing the driving voltage, the third distribution voltage having a voltage level less than the driving voltage;
- a comparator configured to generate the feedback signal based on a comparison between the second distribution voltage and the third distribution voltage, wherein
- the comparator generates a positive feedback signal when the second distribution voltage is greater than the third distribution voltage, and
- the comparator generates a negative feedback signal when the second distribution voltage is less than or equal to the third distribution voltage.

10. The power device of claim 3, wherein the feedback unit comprises:
- a voltage subtraction unit configured to subtract the critical voltage from the driving voltage to generate a subtraction voltage; and
- a comparator configured to generate the feedback signal based on a comparison between the subtraction voltage and the voltage at the output terminal, wherein
- the comparator generates a positive feedback signal when the voltage at the output terminal is greater than the subtraction voltage, and
- the comparator generates a negative feedback signal when the voltage at the output terminal is less than or equal to the subtraction voltage.

11. The power device of claim 3, wherein the feedback unit comprises:
- a voltage distribution unit configured to generate a distribution voltage by distributing the critical voltage, the distribution voltage having a voltage level less than the critical voltage;
- a voltage subtraction unit configured to subtract the distribution voltage from the driving voltage to generate a subtraction voltage; and
- a comparator configured to generate the feedback signal based on a comparison between the subtraction voltage and the voltage at the output terminal,
- wherein the comparator generates a positive feedback signal when the voltage at the output terminal is greater than the subtraction voltage, and
- the comparator generates a negative feedback signal when the voltage at the output terminal is less than or equal to the subtraction voltage.

12. The power device of claim 3, wherein the feedback unit comprises:
- a first voltage distribution unit configured to generate a first distribution voltage by distributing the critical voltage, the first distribution voltage having a voltage level less than the critical voltage;
- a voltage subtraction unit configured to subtract the first distribution voltage from the driving voltage to generate a subtraction voltage;
- a second voltage distribution unit configured to generate a second distribution voltage by distributing the subtraction voltage, the second distribution voltage having a voltage level less than the subtraction voltage; and a third voltage distribution unit configured to generate a third distribution voltage by distributing the voltage at the output terminal, the third distribution voltage having a voltage level less than the voltage at the output terminal; and a comparator configured to generate the feedback signal based on a comparison between the second distribution voltage and the third distribution voltage, wherein the comparator generates a positive feedback signal when the third distribution voltage is greater than the second distribution voltage, and the comparator generates a negative feedback signal when the third distribution voltage is less than or equal to the second distribution voltage.

13. The power device of claim 1, wherein the control unit comprises:

a feedback unit configured to generate a feedback signal based on the voltage at the output terminal; and a driving unit configured to provide the control terminal with the driving voltage based on the feedback signal, the driving voltage having a multi-step waveform in which at least one of a width and a height of each step varies.

14. The power device of claim 13, wherein the feedback signal is a pulse signal having a plurality of pulses, which are sequentially turned on/off as the voltage at the output terminal increases.

15. The power device of claim 14, wherein the plurality of pulses determine a time at which a voltage corresponding to a next step of the multi-step waveform is applied to the control terminal.

16. The power device of claim 13, wherein the feedback unit comprises;

an analog-to-digital converter configured to convert the voltage at the output terminal from an analog value to a digital value; and a pulse generation unit configured to generate a pulse signal including a plurality of pulses, which are each turned on/off according to the digital value.

17. The power device of claim 16, wherein the pulse generation unit is configured to control a pulse width of each of the plurality of pulses in inverse proportion to the inclination of the voltage at the output terminal.

18. The power device of claim 13, wherein the driving unit comprises:

a plurality of voltage generation units configured to generate different levels of voltages; and a driving voltage providing unit configured to, based on the feedback signal, provide a voltage generated by one of the plurality of voltage generation units to the control terminal as the driving voltage.

19. The power device of claim 18, wherein the driving voltage providing unit comprises:

a plurality of switches connected to the plurality of voltage generation units, respectively, each of the plurality of switches being turned on/off based on the feedback signal.

20. The power device of claim 1, wherein the switching device comprises:

a transistor having a gate, a source, and a drain, wherein the control terminal corresponds to the gate, and the output terminal corresponds to the source.

21. The power device of claim 20, wherein the transistor is one of a high electron mobility transistor (HEMT) and a heterojunction field effect transistor (HFET) formed of one of gallium nitride (GaN) and silicon carbide (SiC).

22. A vehicle comprising an electrical component including the power device of claim 1, wherein the power device is configured to generate a power supply voltage by at least one of up-converting, down-converting and inverting a supply voltage from a battery; and the power device comprises an electric motor configured to drive the vehicle according to the power supply voltage.

23. An electric device comprising the power device of claim 1, wherein the power device is configured to generate a power supply voltage by at least one of up-converting, down-converting and inverting a supply voltage; and the power device includes an electric circuit configured to receive the power supply voltage and operate according to the power supply voltage.

24. A gate driving circuit comprising:

a feedback unit configured to generate a feedback signal to control a gate driving voltage based on a source voltage of a transistor; and a gate driving unit configured to control a rising time required for the gate driving voltage to reach a target level based on the feedback signal such that a voltage between a gate and a source of the transistor is maintained less than or equal to a critical voltage; wherein when the voltage between the gate and the source is greater than the critical voltage, leakage current is generated between the gate and the source.

25. The gate driving circuit of claim 24, wherein the gate driving unit selectively provides the gate driving voltage to the gate based on the feedback signal.

26. The gate driving circuit of claim 24, wherein the gate driving unit is configured to apply the gate driving voltage to the gate based on the feedback signal, the driving voltage having a multi-step waveform in which at least one of a width and a height of each step varies.

* * * * *